（12） United States Patent
Ebihara et al.

(10) Patent No.: US 12,363,943 B2
(45) Date of Patent: Jul. 15, 2025

(54) SEMICONDUCTOR DEVICE AND POWER CONVERSION DEVICE

(71) Applicant: Mitsubishi Electric Corporation, Tokyo (JP)

(72) Inventors: Kohei Ebihara, Tokyo (JP); Shiro Hino, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 478 days.

(21) Appl. No.: 17/918,117

(22) PCT Filed: Feb. 17, 2021

(86) PCT No.: PCT/JP2021/005821
§ 371 (c)(1),
(2) Date: Oct. 11, 2022

(87) PCT Pub. No.: WO2021/245992
PCT Pub. Date: Dec. 9, 2021

(65) Prior Publication Data
US 2023/0253492 A1 Aug. 10, 2023

(30) Foreign Application Priority Data
Jun. 4, 2020 (JP) ................................. 2020-097541

(51) Int. Cl.
H10D 30/66 (2025.01)
H10D 12/01 (2025.01)
(Continued)

(52) U.S. Cl.
CPC ......... *H10D 30/665* (2025.01); *H10D 12/031* (2025.01); *H10D 62/8325* (2025.01); *H10D 64/01* (2025.01); *H10D 64/258* (2025.01)

(58) Field of Classification Search
CPC .. H10D 30/665; H10D 12/031; H10D 12/441; H10D 62/106; H10D 62/8325; H10D 64/01; H10D 64/258; H01L 21/049
See application file for complete search history.

(56) References Cited

U.S. PATENT DOCUMENTS

2003/0107102 A1 6/2003 Ozeki et al.
2008/0079079 A1 4/2008 Noguchi et al.
(Continued)

FOREIGN PATENT DOCUMENTS

JP 2003-174169 A 6/2003
JP 2007-115888 A 5/2007
(Continued)

OTHER PUBLICATIONS

International Search Report and Written Opinion mailed on Apr. 27, 2021, received for PCT Application PCT/JP2021/005821, filed on Feb. 17, 2021, 12 pages including English Translation.

*Primary Examiner* — Eric A. Ward
(74) *Attorney, Agent, or Firm* — XSENSUS LLP

(57) ABSTRACT

To mitigate adverse effects on a surface electrode of a semiconductor device. The semiconductor device includes: a first well region formed in a surface layer of an upper surface of a drift layer; a gate electrode; a second well region surrounding the first well region as seen in plan view; and a gate portion covering an interlayer insulation film and the gate electrode exposed from the interlayer insulation film. An outside edge portion of the gate electrode is farther from the first well region than an outside edge portion of the gate portion and closer to the first well region than an outside edge portion of the second well region.

15 Claims, 13 Drawing Sheets

(51) Int. Cl.
*H10D 62/832* (2025.01)
*H10D 64/01* (2025.01)
*H10D 64/23* (2025.01)

(56) References Cited

U.S. PATENT DOCUMENTS

| | | |
|---|---|---|
| 2009/0008708 A1 | 1/2009 | Arai et al. |
| 2010/0224909 A1* | 9/2010 | Oohara ................ H10D 30/665 |
| | | 257/E29.198 |
| 2010/0244146 A1 | 9/2010 | Uno |
| 2012/0061688 A1* | 3/2012 | Watanabe .......... H10D 62/8325 |
| | | 257/77 |
| 2012/0205669 A1 | 8/2012 | Miura et al. |
| 2015/0001549 A1* | 1/2015 | Miura .................. H10D 12/031 |
| | | 257/76 |
| 2020/0321462 A1 | 10/2020 | Hino et al. |

FOREIGN PATENT DOCUMENTS

| | | |
|---|---|---|
| JP | 2008-85188 A | 4/2008 |
| JP | 2009-16482 A | 1/2009 |
| JP | 2010-238885 A | 10/2010 |
| JP | 2013-98316 A | 5/2013 |
| WO | 2011/045834 A1 | 4/2011 |
| WO | 2019/124384 A1 | 6/2019 |

* cited by examiner

F I G. 3
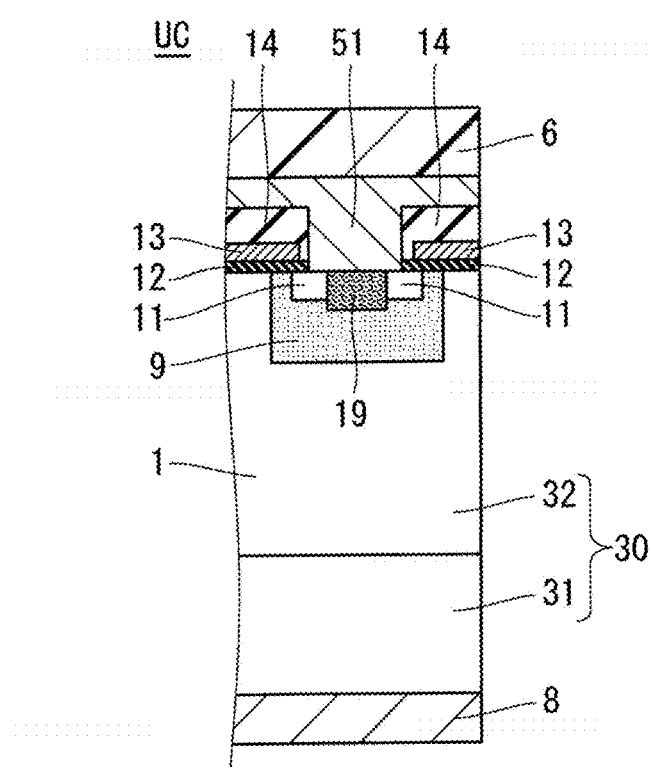

F I G. 8
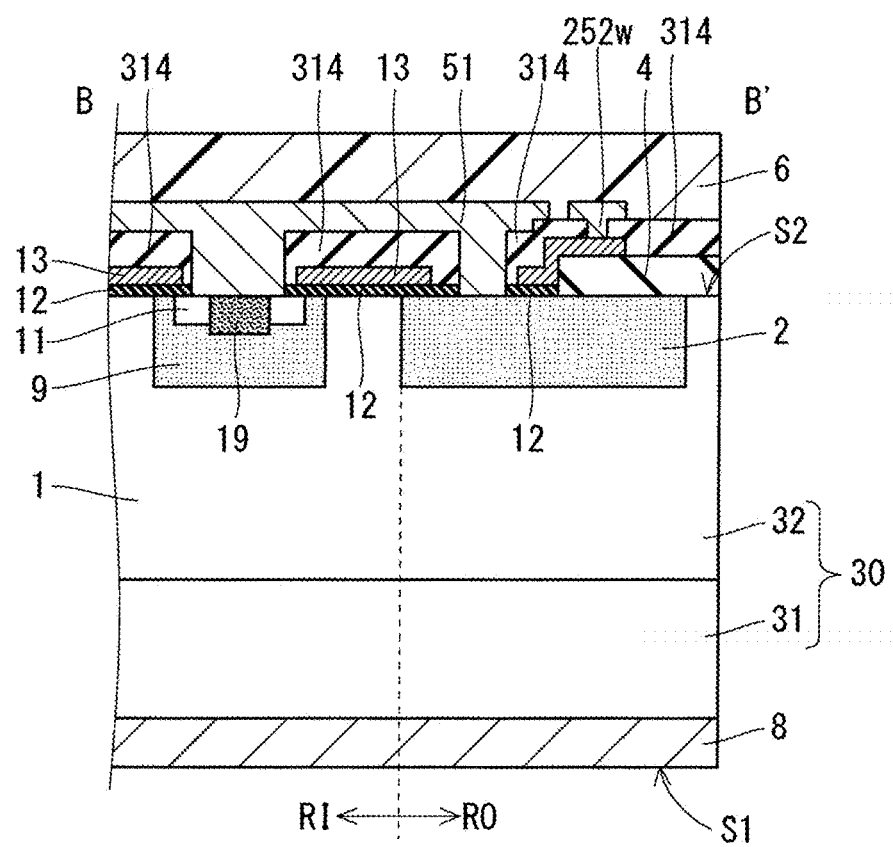

SEMICONDUCTOR DEVICE AND POWER CONVERSION DEVICE

CROSS-REFERENCE TO RELATED APPLICATIONS

The present application is based on PCT filing PCT/JP2021/005821, filed Feb. 17, 2021, which claims priority to JP 2020-097541, filed Jun. 4, 2020, the entire contents of each are incorporated herein by reference.

TECHNICAL FIELD

The technique disclosed in the present description relates to a semiconductor device and a power conversion device.

BACKGROUND ART

In vertical semiconductor devices used for power devices and the like, there has been hitherto known a technique for providing a p type guard ring region (a termination well region) in what is called a termination region of an outer peripheral portion of an n type semiconductor layer in order to ensure breakdown voltage performance (see, for example, Patent Document 1).

In a semiconductor device including a guard ring region, an electric field generated when a reverse voltage is applied to a main electrode of the semiconductor device is mitigated by a depletion layer formed by a pn junction between the n type semiconductor layer and the p type guard ring region. This avoids avalanche breakdown below a rated voltage or destruction and the like in electrode edge portions.

In a MOSFET (Metal Oxide Semiconductor Field Effect Transistor) disclosed in Patent Document 1, a $p^+$ type impurity region is formed so as to protrude outwardly from a gate pad electrode and a gate interconnect electrode which are located on the outermost periphery of a surface electrode. In a semiconductor device such as the MOSFET, the surface electrode is typically covered with a surface protective film made of polyimide or the like except for a region where wire bonding is performed. The surface electrode is encapsulated using an encapsulant material such as gel in some cases.

PRIOR ART DOCUMENTS

Patent Documents

Patent Document 1: Japanese Patent Application Laid-Open No. 2008-85188

SUMMARY

Problem to be Solved by the Invention

The surface protective film made of polyimide or the like and the encapsulant material such as gel as described above are prone to contain moisture in high-humidity environments. There is a likelihood that moisture contained in the surface protective film and the encapsulant material adversely affects the surface electrode. Specifically, there are cases in which the surface electrode dissolves into the moisture or a precipitation reaction occurs due to a reaction between the moisture and the surface electrode.

In such cases, cracking of the surface electrode and the surface protective film or separation of the surface protective film at an interface between the surface electrode and the surface protective film sometimes occurs. If a cavity formed by the cracking of the surface electrode and the surface protective film or the separation of the surface protective film acts as a leakage path, the insulation reliability of the semiconductor device might be impaired.

The technique disclosed in the present description is made in view of the problems as described above, and is a technique for mitigating adverse effects on a surface electrode of a semiconductor device.

Means to Solve the Problem

A first aspect of the technique disclosed in the present description relates to a semiconductor device including: a drift layer of a first conductivity type; a first well region of a second conductivity type formed in a surface layer of an upper surface of the drift layer; a source region of the first conductivity type formed in a surface layer of the first well region; a gate insulation film formed in contact with the first well region sandwiched between the source region and the drift layer; a gate electrode formed in contact with the gate insulation film; an interlayer insulation film covering the gate electrode; a source electrode covering the source region exposed at the upper surface of the drift layer, and the interlayer insulation film; a back surface electrode formed on a lower surface side of the drift layer; a second well region of the second conductivity type formed in the surface layer of the upper surface of the drift layer and surrounding the first well region as seen in plan view; and a field insulation film partially covering the second well region, the gate electrode being formed so as to extend to an upper surface of the field insulation film, the interlayer insulation film partially covering the gate electrode on the upper surface of the field insulation film, the semiconductor device further including a gate portion overlapping the field insulation film as seen in plan view and spaced from the source electrode, the gate portion covering the interlayer insulation film and the gate electrode exposed from the interlayer insulation film, wherein an edge portion in a direction away from the first well region as seen in plan view is defined as an outside edge portion, and wherein the outside edge portion of the gate electrode is farther from the first well region than the outside edge portion of the gate portion and closer to the first well region than the outside edge portion of the second well region.

A second aspect of the technique disclosed in the present description relates to a power conversion device including: a conversion circuit having the aforementioned semiconductor device and for converting inputted power to output converted power; a driving circuit for outputting a driving signal for driving the semiconductor device to the semiconductor device; and a control circuit for outputting a control signal for controlling the driving circuit to the driving circuit.

Effects of the Invention

The first aspect of the technique disclosed in the present description relates to a semiconductor device including: a drift layer of a first conductivity type; a first well region of a second conductivity type formed in a surface layer of an upper surface of the drift layer; a source region of the first conductivity type formed in a surface layer of the first well region; a gate insulation film formed in contact with the first well region sandwiched between the source region and the drift layer; a gate electrode formed in contact with the gate insulation film; an interlayer insulation film covering the gate electrode; a source electrode covering the source region exposed at the upper surface of the drift layer, and the interlayer insulation film; a back surface electrode formed on a lower surface side of the drift layer; a second well region of the second conductivity type formed in the surface layer of the upper surface of the drift layer and surrounding the first well region as seen in plan view; and a field insulation film partially covering the second well region, the gate electrode being formed so as to extend to an upper surface of the field insulation film, the interlayer insulation film partially covering the gate electrode on the upper surface of the field insulation film, the semiconductor device further including a gate portion overlapping the field insulation film as seen in plan view and spaced from the source electrode, the gate portion covering the interlayer insulation film and the gate electrode exposed from the interlayer insulation film, wherein an edge portion in a direction away from the first well region as seen in plan view is defined as an outside edge portion, and wherein the outside edge portion of the gate electrode is farther from the first well region than the outside edge portion of the gate portion and closer to the first well region than the outside edge portion of the second well region. Such a configuration suppresses the generation of precipitates in the edge portion of the gate portion in the termination region. Thus, cracking or separation of the gate portion is suppressed. This suppresses a leakage current increase and a gaseous discharge which result from the cracking or separation of the gate portion to thereby improve the insulation reliability of the semiconductor device.

The second aspect of the technique disclosed in the present description relates to a power conversion device including: a conversion circuit having the aforementioned semiconductor device and for converting inputted power to output the converted power; a driving circuit for outputting a driving signal for driving the semiconductor device to the semiconductor device; and a control circuit for outputting a control signal for controlling the driving circuit to the driving circuit. Such a configuration allows the mitigation of electric field concentration in the outer peripheral edge portion of the gate portion of the semiconductor device included in the power conversion device to suppresses a leakage current increase and a gaseous discharge which result from cracking or separation of the gate portion, thereby improving the insulation reliability of the power conversion device.

These and other objects, features, aspects and advantages of the technique disclosed in the present description will become more apparent from the following detailed description and accompanying drawings.

BRIEF DESCRIPTION OF DRAWINGS

FIG. 3 is a sectional view showing an example of the configuration of a unit cell, which is the smallest unit structure of the MOSFET, formed in an inside region that is an active region shown in FIG. 1.

FIG. 8 is a sectional view of the MOSFET.

DESCRIPTION OF EMBODIMENT(S)

Figure 1:
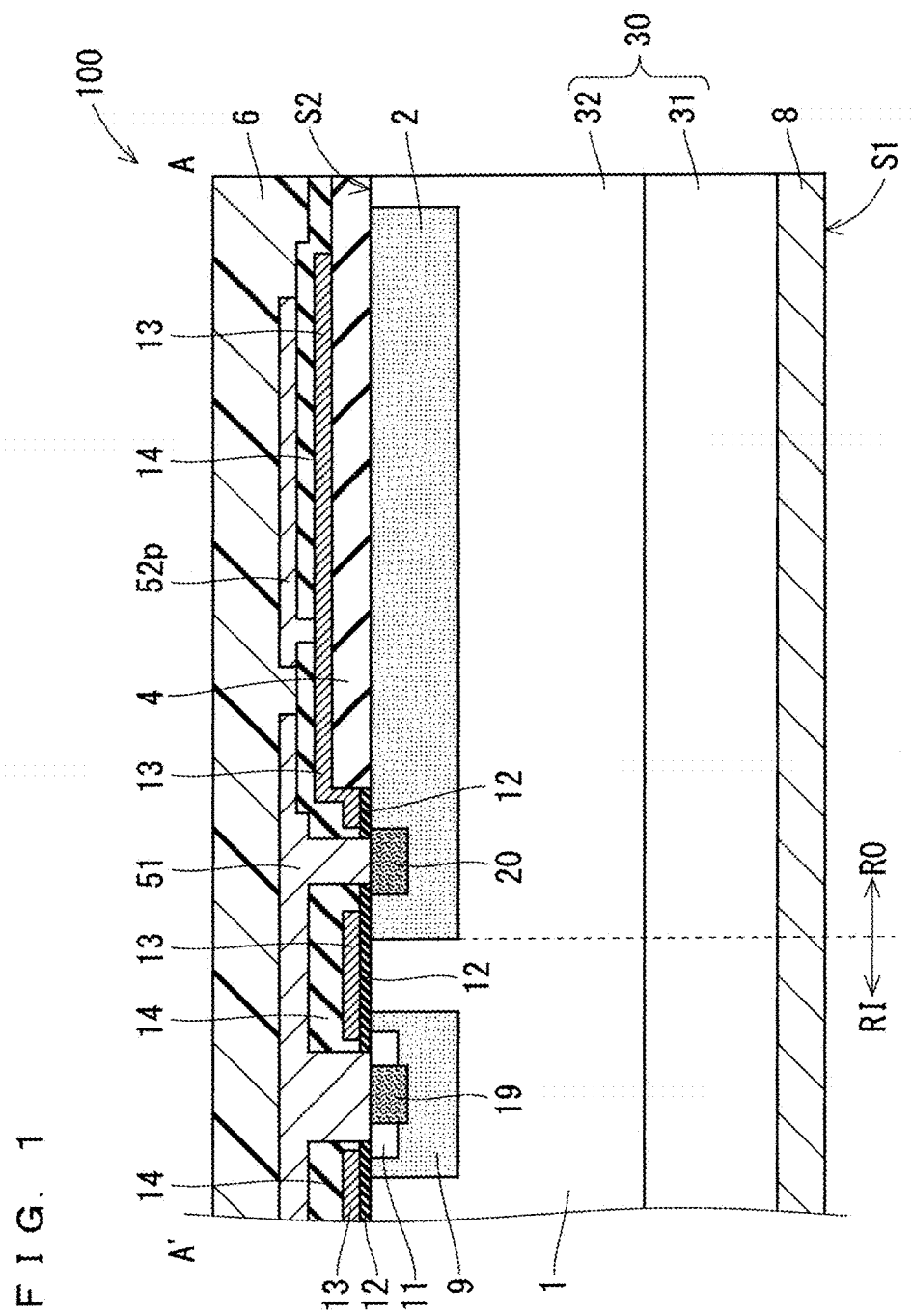
FIG. 1 is a sectional view showing an example of the configuration of a MOSFET that is a semiconductor device according to an embodiment.

Embodiments will now be described with reference to the accompanying drawings. In the following embodiments, detailed features and the like are shown for the purpose of illustrating the technique, but are illustrative. Not all of the detailed features are necessarily essential to make the embodiment feasible.

In the following description, an "active region" of a semiconductor device is defined as a region in which a principal current flows when the semiconductor device is in an ON state, and a "termination region" of the semiconductor device is defined as a region surrounding the active region. The term "outside" of the semiconductor device means a direction from a central portion of the semiconductor device to an outer peripheral portion thereof, and the term "inside" of the semiconductor device means a direction opposite from the "outside". The conductivity types of impurities will be described assuming that a "first conductivity type" is an n type and a "second conductivity type" is a p type. However, the "first conductivity type" and the "second conductivity type" may be contrariwise the p type and the n type, respectively.

The term "MOS" has been used in the past to describe a metal-oxide-semiconductor multi-layer structure, and is said to be an acronym for Metal-Oxide-Semiconductor. However, especially in field-effect transistors with a MOS structure (hereinafter referred to simply as "MOS transistors"), materials of a gate insulation film or a gate electrode have been improved from the viewpoint of recent integration or manufacturing process improvement. For example, in the MOS transistors, polycrystalline silicon has been used as the gate electrode material in place of metal, mainly from the viewpoint of forming a source-drain in a self-aligned manner. From the viewpoint of improving electrical properties, a material with a high dielectric constant is used for the gate insulation film, but the material is not necessarily limited to oxides.

For this reason, the term "MOS" is not necessarily used exclusively for a metal-oxide-semiconductor multi-layer structure, and the same is true herein. In other words, in view of common general technical knowledge, "MOS" is defined not only as an abbreviation for Metal-Oxide-Semiconductor, but also as broadly including a conductor-insulator-semiconductor multi-layer structure.

In the following description, the expressions "on (upper surface)" and "covering" do not preclude the presence of an intervening object between components. For example, even in the case of the expression "B on (on an upper surface of) A", "B covering A", or the like, there can be cases in which other components are provided between A and B. Also, terms that mean specific positions or directions such as "upper", "lower", "left", "right", "side", "bottom", "front", and "back" are used in some cases in the following description. These terms, however, are used for the sake of convenience of description, and have no relation to directions in actual use.

In the drawings, figures show schematic representations, and components are not shown or shown in simplified form, as appropriate, for convenience of illustration. The sizes and positions of components shown in different figures are not necessarily in a correct correlation, but may be changed, as appropriate. In figures that are plan views or the like rather than sectional views, components are in some cases hatched or shaded for the purpose of facilitating the understanding of the details of the embodiments.

In the following description, similar components are designated by and shown using the same reference numerals and characters, and shall have similar designations and functions. Thus, these components will not be described in detail in some cases for the purpose of avoiding repetition in description.

In the following description, the expression "comprising", "including", or "having" a component is not an exclusive expression that excludes the presence of other components, unless otherwise specified.

In the case where ordinal numerals such as "first", "second", or the like are used in the following description, these terms shall be used for the sake of convenience and for the purpose of facilitating the understanding of the details of the embodiments, and shall not be limited to the order caused by the ordinal numerals.

In the following description, expressions indicating an equal state, such as "identical", "equal", "uniform", or "homogeneous", shall include cases in which the expressions indicate a strictly equal state and cases in which differences occur to the extent that tolerances or similar functions are obtained, unless otherwise specified.

First Embodiment

A semiconductor device and a method of manufacturing the semiconductor device according to a first embodiment will be described.

<Configuration of Semiconductor Device>

Figure 2:
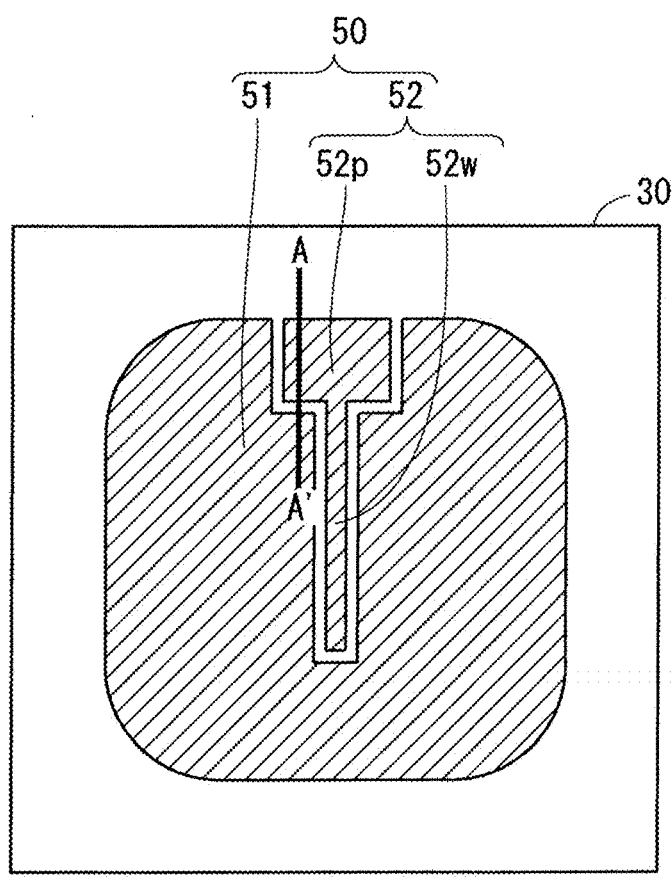
FIG. 2 is a plan view of the MOSFET.

FIG. 1 is a sectional view showing an example of the configuration of a MOSFET 100 that is the semiconductor device according to the present embodiment. FIG. 2 is a plan view of the MOSFET 100. A section taken along a line A-A' in FIG. 2 corresponds to FIG. 1. FIG. 3 is a sectional view showing an example of the configuration of a unit cell UC, which is the smallest unit structure of the MOSFET 100, formed in an inside region RI that is an active region shown in FIG. 1. Multiple unit cells UC one of which is shown in FIG. 3 are arranged in the inside region RI of the MOSFET 100. A structure shown at the left end of FIG. 1 is an outermost unit cell UC in the inside region RI.

As an example is shown in FIG. 1, the MOSFET 100 is formed using an epitaxial substrate 30 comprised of a monocrystalline substrate 31 and an epitaxial layer 32 formed on an upper surface of the monocrystalline substrate 31. The monocrystalline substrate 31 is a semiconductor substrate made of silicon carbide (SiC) of an n type (a first conductivity type). The epitaxial layer 32 is an n type semiconductor layer of SiC epitaxially grown on the upper surface of the monocrystalline substrate 31. In other words, the MOSFET 100 is a SiC-MOSFET. The epitaxial substrate 30 having a 4H polytype is used in the present embodiment.

In the active region (i.e., the inside region RI), a device well region 9 of a p type (a second conductivity type) is selectively formed in a surface layer portion of an upper surface of the epitaxial layer 32. An n type source region 11 and a p type contact region 19 having an impurity concentration higher than that of the device well region 9 are selectively formed in a surface layer portion of the device well region 9.

Figure 4:
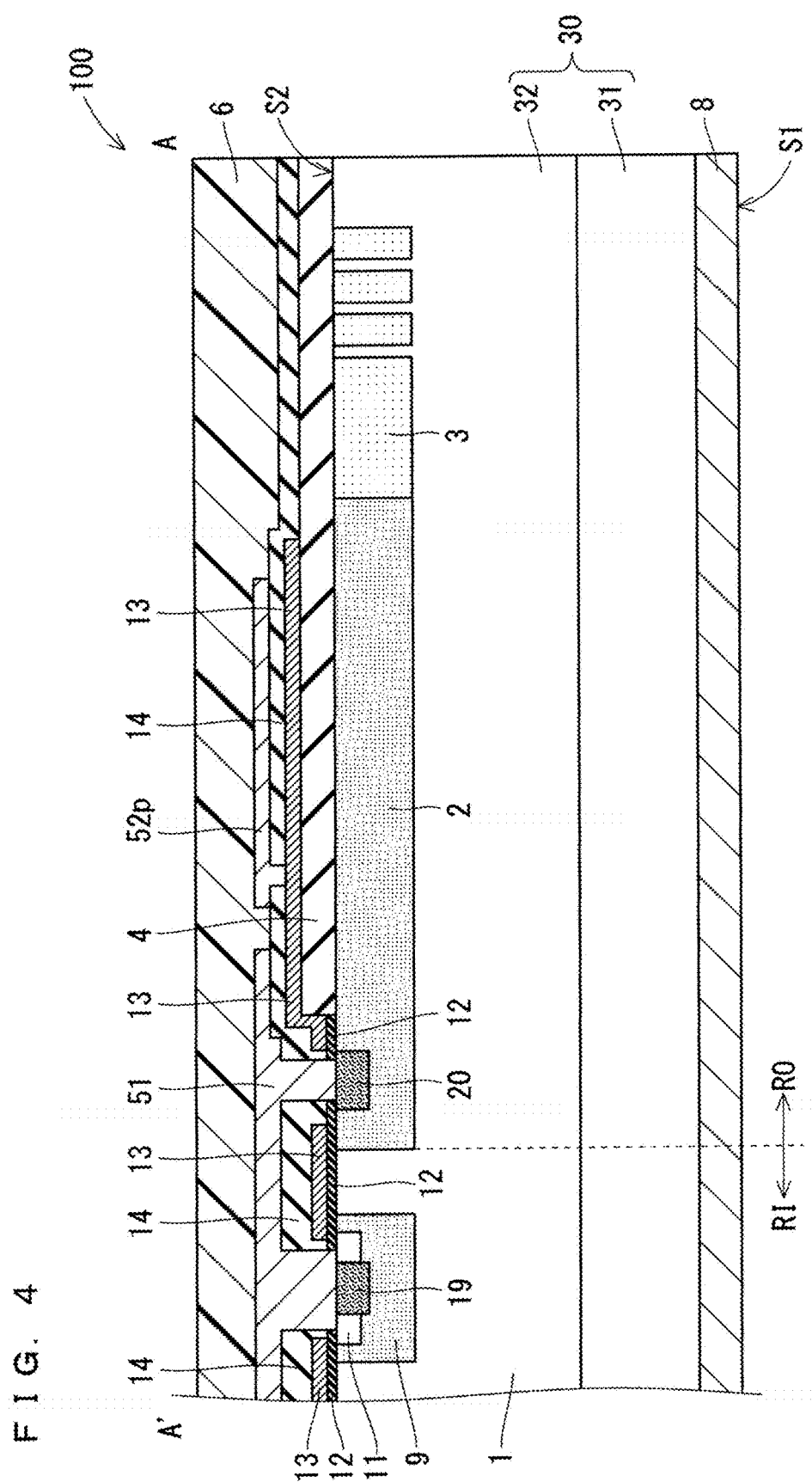
FIG. 4 is a sectional view showing a modification of the configuration of the MOSFET according to the embodiment.

In the termination region (i.e., an outside region RO surrounding the inside region RI), a p type termination well region 2 is selectively formed in the surface layer portion of the upper surface of the epitaxial layer 32 so as to surround the active region as seen in plan view (i.e. so as to surround the device well region 9 as seen in plan view). A p type high-concentration portion 20 having a relatively high impurity concentration is formed in a surface layer portion of the termination well region 2. The conductivity type of the high-concentration portion 20 is not limited to the p type but may be the n type. FIG. 4 is a sectional view showing a modification of the configuration of the MOSFET according to the present embodiment. As an example is shown in FIG. 4, a p type low-concentration well region 3 may be provided around the outer periphery of the termination well region 2. The low-concentration well region 3 is formed in a surface layer of an upper surface of a drift layer 1, and surrounds the termination well region 2 as seen in plan view. The impurity concentration of the low-concentration well region 3 is not higher than that of the termination well region 2. Alternatively, multiple low-concentration well regions 3 may be provided in circumferentially spaced apart relation.

As examples are shown in FIGS. 1 and 4, an n type region of the epitaxial layer 32 excepting the aforementioned impurity regions (the device well region 9, the source region 11, the contact region 19, the termination well region 2, and the low-concentration well region 3) is the drift layer 1 in which current flows due to a drift. The impurity concentration of the drift layer 1 is lower than that of the monocrystalline substrate 31. For this reason, the monocrystalline substrate 31 has a resistivity lower than that of the drift layer 1. The impurity concentration of the drift layer 1 in the present embodiment is, for example, in the range of $1 \times 10^{14}/\text{cm}^3$ to $1 \times 10^{17}/\text{cm}^3$.

The termination well region 2 is a frame-shaped (ring-shaped) region surrounding the active region as seen in plan view, and functions as what is called a guard ring. As examples are shown in FIGS. 1 and 4, an inside (inner peripheral) edge portion of the termination well region 2 is defined as a boundary between the inside region RI or the active region which is inside the boundary and the outside region RO or the termination region which is outside the boundary in the present embodiment.

As examples are shown in FIGS. 1 and 4, a gate insulation film 12 is formed on an upper surface S2 of the epitaxial substrate 30 in the active region so as to span the device well region 9 sandwiched between the source region 11 and the drift layer 1 as seen in plan view. A gate electrode 13 is formed on an upper surface of the gate insulation film 12. A surface layer portion of the device well region 9 covered with the gate insulation film 12 and the gate electrode 13, i.e. a portion of the device well region 9 which is sandwiched between the source region 11 and the drift layer 1, is a channel region in which an inversion channel is formed when the MOSFET 100 is in the ON state.

In the active region, the gate electrode 13 is covered with an interlayer insulation film 14, and a source electrode 51 is formed on an upper surface of the interlayer insulation film 14. The interlayer insulation film 14 has an elemental composition of, for example, boron or phosphorus. Thus, the gate electrode 13 and the source electrode 51 are electrically insulated from each other by the interlayer insulation film 14.

The source electrode 51 is connected to the source region 11 and the contact region 19 through a contact hole formed in the interlayer insulation film 14 and the gate insulation film 12. The source electrode 51 and the contact region 19 form an ohmic contact. A front surface protective film 6 is formed to cover the source electrode 51, a gate pad 52p, and the interlayer insulation film 14 not covered with the source electrode 51 and the gate pad 52p but exposed. A back surface electrode 8 functioning as a drain electrode is formed on a lower surface S1 of the epitaxial substrate 30.

As examples are shown in FIGS. 1 and 4, portions of the gate insulation film 12, the gate electrode 13, the interlayer insulation film 14, and the source electrode 51 in the inside region RI extend beyond the boundary between the inside region RI and the outside region RO to the outside region RO. The source electrode 51 extended to the outside region RO is connected through a contact hole formed in the interlayer insulation film 14 to form an ohmic contact or Schottky contact with the high-concentration portion 20 in the termination well region 2.

A field insulation film 4 having a thickness greater than that of the gate insulation film 12 is provided on the upper surface S2 of the epitaxial substrate 30 in termination region. The gate electrode 13 extended to the outside region RO is formed, with a portion thereof riding on an upper surface of the field insulation film 4, and is disposed over the termination well region 2, with the gate insulation film 12 or the field insulation film 4 therebetween.

The field insulation film 4 covers a portion of the termination well region 2, and extends beyond an outer peripheral edge of the termination well region 2 to the outside of the termination well region 2. The field insulation film 4 is not provided in the inside region RI. In other words, the field insulation film 4 has an opening including the inside region RI as seen in plan view.

In the present embodiment, the interlayer insulation film 14 covering the gate electrode 13 extends to the outside of the termination well region 2 and is formed on the upper surface of the field insulation film 4.

Further, the gate pad 52p is formed in the termination region in a position taken along the line A-A' of FIG. 2. The gate pad 52p is formed on the upper surface of the interlayer insulation film 14 covering the gate electrode 13 extended to the outside region RO, and is connected to the gate electrode 13 through a contact hole formed in the interlayer insulation film 14.

Figure 5:
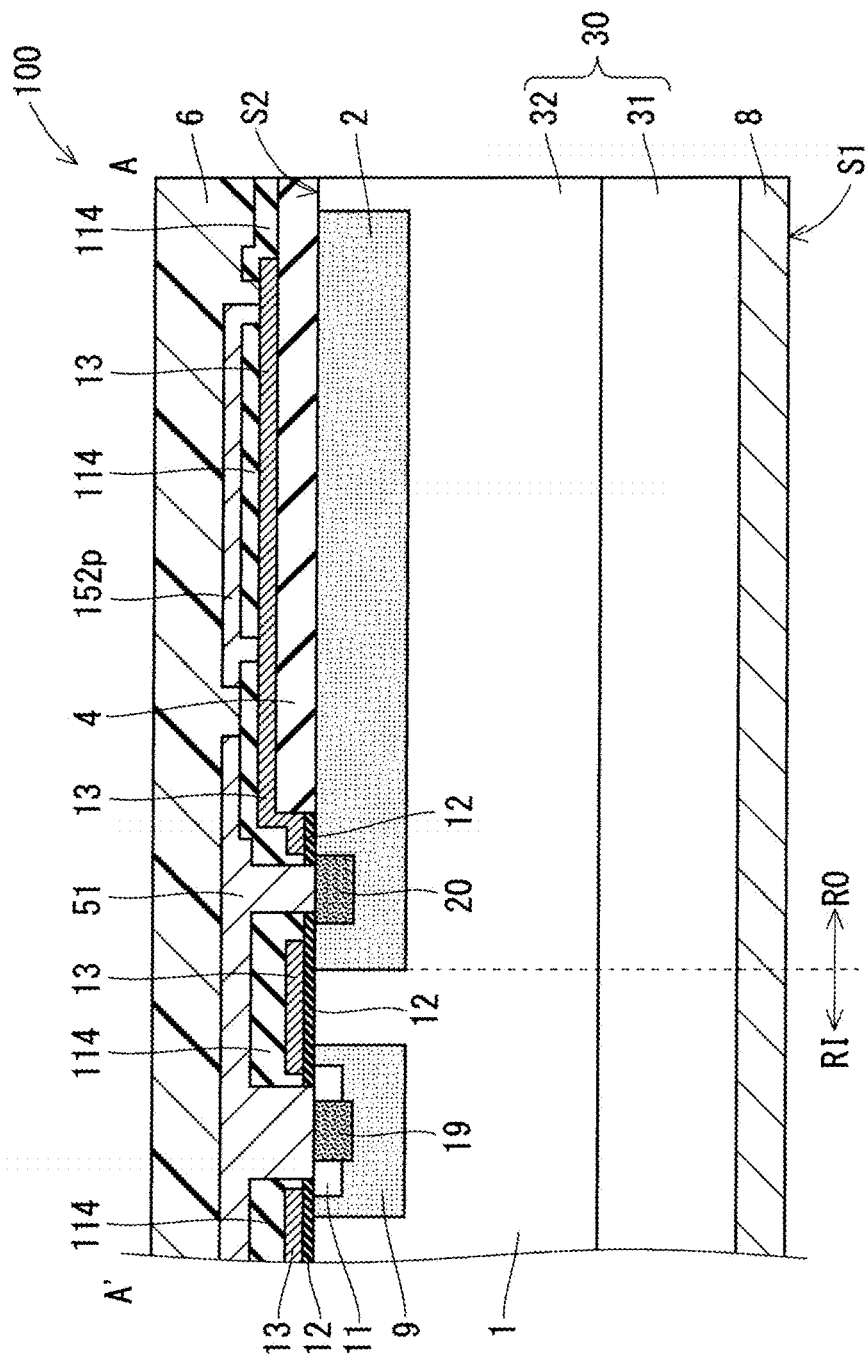
FIG. 5 is a sectional view showing a modification of the configuration of the MOSFET according to the embodiment.

FIG. 5 is a sectional view showing a modification of the configuration of the MOSFET according to the present embodiment. Multiple contact holes one of which is described above may be formed. As an example is shown in FIG. 5, a contact hole may be formed in an interlayer insulation film 114 in the position of the outermost periphery of a gate pad 152p, and the gate pad 152p and the gate electrode 13 may be connected to each other on the outermost periphery of the gate pad 152p.

As an example is shown in FIG. 2, a gate interconnect line 52w connected to the gate pad 52p extends to a central portion of the MOSFET 100. The gate pad 52p is disposed so as to be partially surrounded by the source electrode 51 (so as to enter a region surrounded by a region in which the source electrode 51 is formed) as seen in plan view.

A gate portion 52 (i.e., the gate pad 52p and the gate interconnect line 52w) functions as an electrode that receives a gate control signal for controlling an electrical path between the source electrode 51 and the back surface electrode 8. The gate portion 52 (i.e., the gate pad 52p and the gate interconnect line 52w) is spaced from the source electrode 51, and is electrically insulated from the source electrode 51.

In FIGS. 1, 4, and 5, the field insulation film 4 is formed on the outside of a connection portion between the high-concentration portion 20 in the termination well region 2 and the source electrode 51. However, the field insulation film 4 may be formed to extend to the inside of the connection portion between the high-concentration portion 20 and the source electrode 51. In this case, the source electrode 51 is connected to the high-concentration portion 20 in the termination well region 2 through a contact hole extending through both the interlayer insulation film 14 and the field insulation film 4.

In the MOSFET 100 of the present embodiment, an outer peripheral edge portion of the gate electrode 13 is positioned between an outer peripheral edge portion of the gate pad 52p (or the gate pad 152p) and an outer peripheral edge portion of the termination well region 2 in the position taken along the line A-A' of FIG. 2. The outer peripheral edge portion of the gate electrode 13 may be positioned between the outer peripheral edge portion of the gate pad 52p (or the gate pad 152p) and the outer peripheral edge portion of the termination well region 2 not only in the position taken along the line A-A' of FIG. 2 but also in all regions of the outer peripheral edge portion of the gate pad 52p (or the gate pad 152p).

Figure 6:
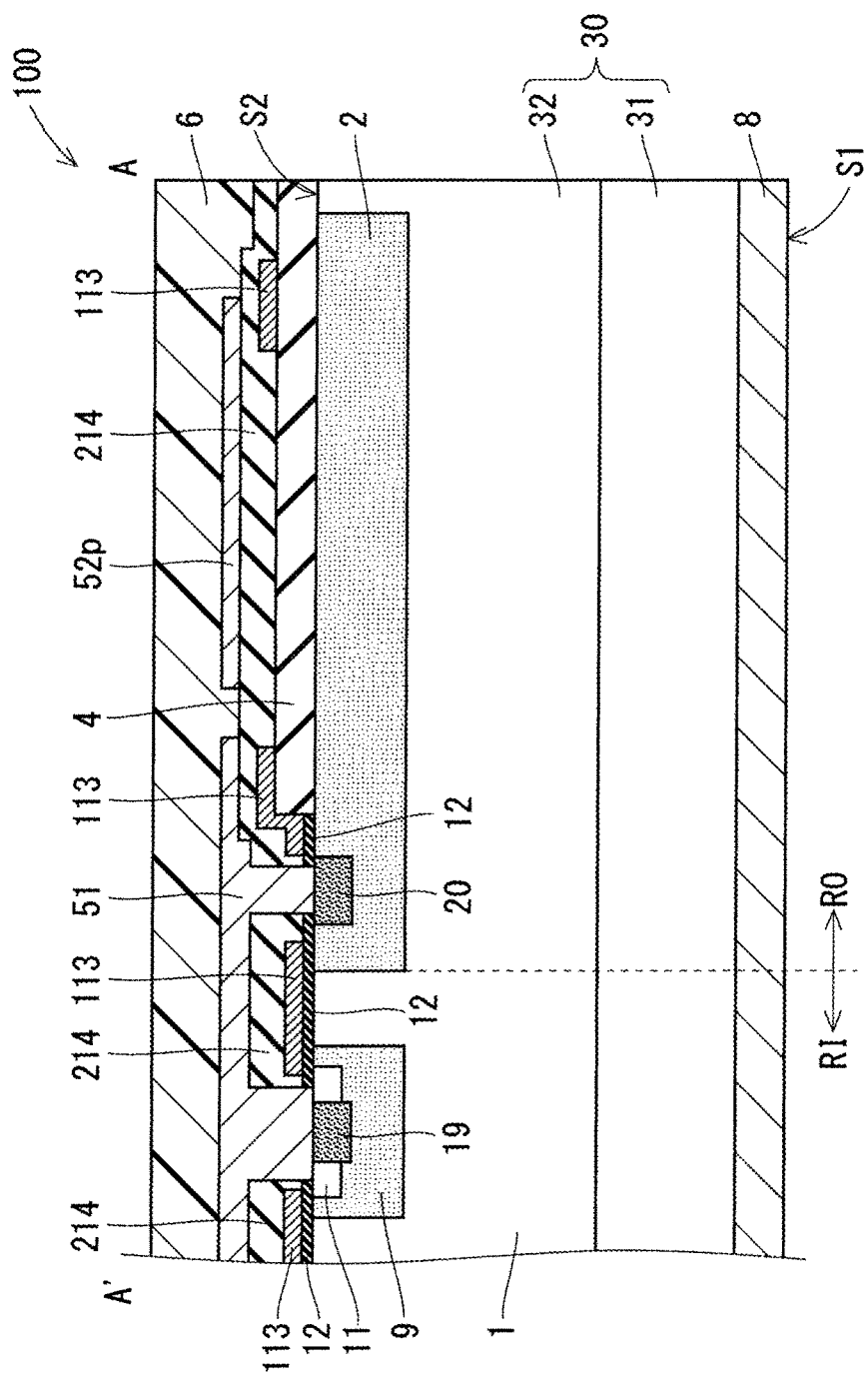
FIG. 6 is a sectional view showing a modification of the configuration of the MOSFET according to the embodiment.

FIG. 6 is a sectional view showing a modification of the configuration of the MOSFET according to the present embodiment. As an example is shown in FIG. 6, a gate electrode 113 need not necessarily be formed in the entire region lying under the gate pad 52p. The gate electrode 113 is formed in a position corresponding to the outer peripheral edge portion of the gate pad 52p, but is not formed in positions corresponding to other portions of the gate pad 52p (in other words, an opening is formed as seen in plan view). An interlayer insulation film 214 is formed in that region. The gate electrode 113 is connected to the gate pad 52p or the gate interconnect line 52w in a position not shown in FIG. 6.

In the present embodiment, SiC is assumed as the material of the epitaxial substrate 30, but the material of the epitaxial substrate 30 is not limited to SiC but may be other wide bandgap semiconductors such as gallium nitride (GaN), for example.

The semiconductor device according to the present embodiment may be a transistor other than the MOSFET, such as a JFET (Junction FET), an IGBT (Insulated Gate Bipolar Transistor), or the like. Furthermore, although a planar type transistor is illustrated in the present embodiment, the transistor may be of a trench type.

<Operation of Semiconductor Device>

An operation of the MOSFET 100 according to the present embodiment shown in FIGS. 1 and 2 as an example will be described below in two states.

A first state is a state in which a positive voltage that is not less than a threshold value is applied to the gate electrode 13, and this state is referred to hereinafter as an "ON state". When the MOSFET 100 is in the ON state, an inversion channel is formed in the channel region. The inversion channel becomes a path for electrons as carriers to flow between the source region 11 and the drift layer 1. In the ON state, when a high voltage is applied to the back surface electrode 8 with respect to the potential of the source electrode 51 as a reference, a current passing through the monocrystalline substrate 31 and the drift layer 1 flows. On this occasion, a voltage between the source electrode 51 and the back surface electrode 8 is referred to as an "ON-state voltage", and a current flowing between the source electrode 51 and the back surface electrode 8 is referred to as an "ON-state current". The ON-state current flows only in the active region in which a channel is present, and does not flow in the termination region.

A second state is a state in which a voltage that is less than the threshold value is applied to the gate electrode 13, and this state is referred to hereinafter as an "OFF state". When the MOSFET 100 is in the OFF state, the inversion channel is not formed in the channel region. Accordingly, the ON-state current does not flow. For this reason, when a high voltage is applied between the source electrode 51 and the back surface electrode 8, this high voltage is maintained. On this occasion, a high voltage is applied also between the gate electrode 13 and the back surface electrode 8 because a voltage between the gate electrode 13 and the source electrode 51 is very small relative to the voltage between the source electrode 51 and the back surface electrode 8.

In the OFF state, a high voltage is applied between the back surface electrode 8 and each of the gate pad 52p, the gate interconnect line 52w, and the gate electrode 13 in the termination region. An electrical contact is formed between the termination well region 2 and the source electrode 51 in the termination region in the same manner that an electrical contact is formed between the device well region 9 and the source electrode 51 in the active region. This prevents a high electric field from being applied to the gate insulation film 12, the field insulation film 4, and the interlayer insulation film 14.

When the MOSFET 100 is in the OFF state, a large electric field is applied near interfaces of pn junctions between the drift layer 1 and the device well region 9 and between the drift layer 1 and the termination well region 2. A voltage applied to the back surface electrode 8 when this electric field reaches a critical electric field to result in an avalanche breakdown is defined as the maximum voltage (avalanche voltage) of the MOSFET 100. In general, a rated voltage is determined so that the MOSFET 100 is used in a voltage range in which the avalanche breakdown does not occur.

In the OFF state of the MOSFET 100, a depletion layer extends from the pn junction interfaces between the drift layer 1 and the device well region 9 and between the drift layer 1 and the termination well region 2 toward the monocrystalline substrate 31 (in a downward direction as seen in FIG. 1) and toward the outer periphery of the drift layer 1 (in a direction from the inside region RI toward the outside region RO as seen in FIG. 1). The depletion layer extends also from the pn junction interface between the drift layer 1 and the termination well region 2 into the termination well region 2, and the extent of this extension is highly dependent on the impurity concentration in the termination well region 2. Specifically, when the impurity concentration of the termination well region 2 is increased, the extension of the depletion layer in the termination well region 2 is suppressed, and the forward end of the depletion layer is located near a boundary between the termination well region 2 and the drift layer 1.

The forward end position of the depletion layer may be investigated by means of TCAD (Technology CAD) simulations and the like. In the outside region RO, a potential difference occurs from an outer peripheral side of the epitaxial layer 32 toward the center thereof in the depletion layer (depleted region) inside the epitaxial layer 32. A non-depleted region inside the termination well region 2 may be regarded as being at substantially the same potential as the source electrode 51.

In a semiconductor device using a material such as SiC in which electric field strength is especially high in the OFF state, a high electric field is applied to an edge portion of an electrode material to result in destruction of the electrode material in some cases if the edge portion of the electrode material is positioned in a location where the upper surface of the epitaxial layer 32 is depleted. In the MOSFET 100 according to the present embodiment, the impurity concentration of the termination well region 2 is hence generally set to an impurity concentration that does not deplete the inside of the termination well region 2 under the gate electrode 13 and the gate pad 52p.

An instance in which the MOSFET 100 is in the OFF state under conditions of high humidity will now be considered. An encapsulation resin provided so as to cover a semiconductor chip can contain moisture. For example, when the front surface protective film 6 (upper surface film) is made of a resin material with high water absorbency such as polyimide, the front surface protective film 6 contains much moisture under the conditions of high humidity, so that there is apprehension that the moisture reaches the upper surfaces of the epitaxial layer 32 and the gate pad 52p. Even when the front surface protective film 6 is made of a highly moisture-resistant material such as SiN, cracks are prone to appear in the front surface protective film 6 due to stresses generated during the process, so that there is apprehension that the epitaxial layer 32 and the gate pad 52p are exposed to moisture through the cracks.

In such a state, the voltage applied to the MOSFET 100 that is in the OFF state causes an edge portion of the epitaxial layer 32 to act as an anode and causes the gate pad 52p to act as a cathode in the termination region. Further, when a negative voltage is applied to the gate pad 52p with respect to the source electrode 51, the gate pad 52p acts as a cathode for the source electrode 51 and the termination well region 2 connected to the source electrode 51. In the vicinity of the gate pad 52p acting as the cathode, moisture causes an oxygen reduction reaction represented by Equation (1) below and a hydrogen production reaction represented by Equation (2) below.

[Math. 1]

$$O_2 + 2H_2O + 4e^- \rightarrow 4OH^- \tag{1}$$

[Math. 2]

$$H_2O + e^- \rightarrow OH^- + 1/2 H_2 \tag{2}$$

This accordingly increases the concentration of hydroxide ions in the vicinity of the gate pad 52p. The hydroxide ions react chemically with the gate pad 52p. For example, if the gate pad 52p is composed of aluminum, there are cases in which the aforementioned chemical reactions cause the aluminum to become aluminum hydroxide.

The reaction between aluminum and hydroxide ions is accelerated in accordance with the electric field strength of the surroundings. A potential gradient is generated in a depleted region inside a semiconductor layer. For this reason, a potential gradient along the upper surface S2 is generated in a region where a depletion layer reaches the upper surface of the epitaxial substrate 30 in the MOSFET 100 according to the present embodiment. An electric field is generated around an edge portion of the gate pad 52p because this potential gradient is carried over to the field insulation film 4 and the interlayer insulation film 14 which are formed on the upper surface S2 of the epitaxial layer 32. When electric field strength in the edge portion of the gate pad 52p hence reaches a certain level or above, an aluminum hydroxide production reaction occurs, and the reaction is accelerated with the increase in electric field strength.

When a negative voltage is applied to the gate pad 52p with respect to the source electrode 51, electric field strength under the gate pad 52p increases due to a potential difference between the gate pad 52p and the termination well region 2. In particular, electric field concentration is prone to occur in an outer peripheral edge portion under the gate pad 52p, so that the production of aluminum hydroxide is accelerated.

When the interlayer insulation film 14 contains boron (B) or phosphorus (P), the interlayer insulation film 14 tends to absorb moisture as the concentration thereof increases. For example, when the concentration of boron exceeds 2% and the concentration of phosphorus exceeds 5%, this tendency becomes more pronounced, and the production of aluminum hydroxide is accelerated.

When aluminum hydroxide is produced on the front surface of the gate pad 52p as described above, volume expansion causes cracking or separation of the gate pad 52p and the front surface protective film 6 to create cavities on the upper surface of the interlayer insulation film 14. Moisture enters the cavities to cause an excessive leakage current flow or a gaseous discharge in the cavities, thereby resulting in the apprehension of device breakdown of the MOSFET 100.

In the MOSFET 100 according to the present embodiment, on the other hand, the outer peripheral edge portion of the gate pad 52p is on the inner side of the outer peripheral edge portion of the termination well region 2 in the position taken along the line A-A' of FIG. 2. This mitigates the electric field strength around the gate pad 52p.

If the impurity concentration of the termination well region 2 is not less than a predetermined level, the depletion layer will hardly extend to the inside of the termination well region 2. This effectively mitigates the electric field strength around the gate pad 52p to thereby effectively suppress the production of aluminum hydroxide.

Further, as an example is shown in FIG. 4, the provision of the low-concentration well region 3 in the outer peripheral portion of the termination well region 2 effectively mitigates the electric field strength around the gate pad 52p and also mitigates the electric field strength of the epitaxial layer 32 around the outer peripheral edge portion of the termination well region 2. This increases the avalanche voltage of the MOSFET 100.

In the MOSFET 100 according to the present embodiment, the outer peripheral edge portion of the gate electrode 13 is on the outer side of the outer peripheral edge portion of the gate pad 52p in the position taken along the line A-A' of FIG. 2. Thus, when a negative voltage is applied to the gate pad 52p with respect to the source electrode 51, the potential difference between the gate pad 52p and the termination well region 2 is generated only inside the field insulation film 4 under the gate electrode 13 in a region where the gate electrode 13 is provided between the gate pad 52p and the termination well region 2. This mitigates the electric field strength around the gate pad 52p.

Thus, in the MOSFET 100 according to the present embodiment, the gate electrode 13 is present under the outer peripheral edge portion of the gate pad 52p where the electric field concentration is especially prone to occur. This mitigates the electric field concentration in the outer peripheral edge portion under the gate pad 52p to suppress the production of aluminum hydroxide.

On the other hand, if the gate electrode 13 is not provided between the gate pad 52p and the termination well region 2, the potential difference between the gate pad 52p and the termination well region 2 is shared by the field insulation film 4 and the interlayer insulation film 14. Thus, the electric field strength inside the field insulation film 4 is mitigated. This suppresses the reduction in yield due to intruding dust or the like during the manufacture of the MOSFET 100.

As an example is shown in FIG. 6, the gate electrode 113 is partially open under the gate pad 52p except in a region where the gate electrode 113 is formed in a position that straddles the outer peripheral edge portion of the gate pad 52p. This mitigates the electric field concentration in the outer peripheral edge portion under the gate pad 52p where the electric field concentration is especially prone to occur to suppress the reduction in yield.

When the outer peripheral edge portion of the gate electrode 13 is positioned between the outer peripheral edge portion of the gate pad 52p and the outer peripheral edge portion of the termination well region 2 not only in the position taken along the line A-A' of FIG. 2 but also in all regions of the outer peripheral edge portion of the gate pad 52p, the electric field concentration is mitigated in all regions of the outer peripheral edge portion under the gate pad 52p, so that the production of aluminum hydroxide is suppressed.

As an example is shown in FIG. 5, the contact hole is formed in the interlayer insulation film 114 in the position of the outermost periphery of the gate pad 152p, so that the gate pad 152p and the gate electrode 13 are connected to each other through the contact hole on the outermost periphery of the gate pad 152p. This sufficiently suppresses the electric field concentration in the outer peripheral edge portion under the gate pad 52p to suppress the production of aluminum hydroxide.

As described above, the production of aluminum hydroxide in the edge portion of the gate pad 52p (or the gate pad 152p) is suppressed in the MOSFET 100 according to the present embodiment. As a result, this suppresses a leakage current increase and a gaseous discharge which result from cracking or separation of the gate pad 52p (or the gate pad 152p) and the front surface protective film 6.

<Method of Manufacturing Semiconductor Device>

Next, a method of manufacturing the MOSFET 100 as a semiconductor device according to the present embodiment will be described.

First, the low-resistance monocrystalline substrate 31 containing a relatively high concentration of n type impurities (n+ type) is prepared. In the present embodiment, the monocrystalline substrate 31 shall be a SiC substrate having a 4H polytype and an off angle of 4 or 8 degrees.

Next, epitaxial growth of SiC is performed on the upper surface of the monocrystalline substrate 31 to form the n type epitaxial layer 32 having an impurity concentration in the range of $1 \times 10^{14}/cm^3$ to $1 \times 10^{17}/cm^3$ on the upper surface of the monocrystalline substrate 31. This provides the epitaxial substrate 30 comprised of the monocrystalline substrate 31 and the epitaxial layer 32.

Next, impurity regions are formed in the surface layer portion of the epitaxial layer 32 by repeating a photolithography step in which a resist mask is formed and an ion implantation step in which ion implantation is performed using the resist mask as an implantation mask. Thus, the termination well region 2, the device well region 9, the contact region 19, the high-concentration portion 20, and the source region 11 are formed in the surface layer portion of the epitaxial layer 32. Similarly, the low-concentration well region 3 may be formed.

In the ion implantation step, N (nitrogen) or the like is used as n type impurities, and Al, B, or the like is used as p type impurities. The termination well region 2 and the device well region 9 may be formed together in the same ion implantation step. Also, the contact region 19 and the high-concentration portion 20 in the termination well region 2 can be formed together in the same ion implantation step.

The device well region 9 has an impurity concentration, for example, in the range of $1.0 \times 10^{18}/cm^3$ to $1.0 \times 10^{20}/cm^3$.

The impurity concentration of the source region 11 and the impurity concentration of the contact region 19 are higher than that of the device well region 9 and are, for example, in the range of $1.0 \times 10^{19}/cm^3$ to $1.0 \times 10^{22}/cm^3$.

The termination well region 2 is required to ensure sufficient amounts of impurities that make it difficult for the depletion layer to extend into the termination well region 2 in the OFF state. Thus, the dose of the termination well region 2 is preferably not less than $2.0 \times 10^{13}/cm^2$, and is, for example, $5.0 \times 10^{13}/cm^2$.

The dose of the low-concentration well region 3 is preferably in the range of $0.5 \times 10^{13}/cm^2$ to $5 \times 10^{13}/cm^2$, and is, for example, $1.0 \times 10^{13}/cm^2$.

The implantation energy for ion implantation is, for example, in the range of 100 to 700 keV when the impurity is Al. In this case, the impurity concentration of the low-concentration well region 3 converted from the aforementioned dose [cm$^{-2}$] is in the range of $1 \times 10^{17}/cm^3$ to $1 \times 10^{19}/cm^3$. The implantation energy for ion implantation is, for example, in the range of 20 to 300 keV when the impurity is N.

Thereafter, a heat treatment apparatus is used to perform an annealing process at a temperature of 1500° C. or higher. This activates the impurities doped by the ion implantation.

Next, a SiO$_2$ film having a thickness in the range of 0.5 to 2 μm is formed on the upper surface S2 of the epitaxial substrate 30, for example, using a chemical vapor deposition (CVD) process. Then, the field insulation film 4 is formed by patterning the SiO$_2$ film using a photolithography step and an etching step. In this process, the field insulation film 4 is patterned into a configuration that covers a portion of the termination well region 2 and extends beyond an edge portion of the termination well region 2 to the outer side of the termination well region 2.

Next, the upper surface of the epitaxial layer 32 which is not covered with the field insulation film 4 is thermally oxidized, whereby an SiO$_2$ film as the gate insulation film 12 is formed. Then, a conductive polycrystalline silicon film is formed on the upper surface of the gate insulation film 12 by a low pressure CVD process, and is patterned using a photolithography step and an etching step, whereby the gate electrode 13 is formed.

In this process, the gate electrode 13 in the termination region is formed so as to ride on the upper surface of the field insulation film 4 and to have an outer peripheral edge portion positioned on the inner side of the outer peripheral edge portion of the termination well region 2.

Thereafter, an SiO$_2$ film as the interlayer insulation film 14 is formed by a CVD process. Then, contact holes extending through the gate insulation film 12 and the interlayer insulation film 14 to reach the contact region 19, the source region 11, and the high-concentration portion 20 in the termination region are formed using a photolithography step and an etching step. In this step, a contact hole extending through the interlayer insulation film 14 to reach the gate electrode 13 is formed in the termination region.

The interlayer insulation film 14 may be BPSG (boron phosphor silicate glass) obtained by doping SiO$_2$ with B and P or a multi-layer film containing SiO$_2$, SiN, BPSG, and the like. The BPSG is formed to have a smoothly stepped shape by an annealing process at 1000° C. This improves the embeddability of electrodes into contact holes to allow the formation of microstructures.

Next, a material layer for a front surface electrode 50 including the source electrode 51 and the gate portion 52 (i.e., the gate pad 52p and the gate interconnect line 52w) is formed on the upper surface S2 of the epitaxial substrate 30 by a sputtering process or a vapor deposition process. A similar method is used to form a material layer for the back surface electrode 8 on the lower surface S1 of the epitaxial substrate 30.

The front surface electrode 50 is formed by a foundation layer containing one or more selected from the group consisting of Ti, Ni, W, Mo, and Au, for example, and for providing an electrical contact to the epitaxial substrate 30, and a thick-film layer made of metal including one or more selected from the group consisting of Al and Cu or an Al alloy such as Al—Si.

Metal including one or more selected from the group consisting of Ti, Ni, Al, Cu, and Au, for example, is used as the material of the back surface electrode 8. A silicide film may be formed by heat treatment in advance in a portion of the epitaxial substrate 30 which contacts the front surface electrode 50 or the back surface electrode 8. The formation of the back surface electrode 8 may be performed at the end of all steps.

Next, the front surface electrode 50 is patterned using a photolithography step and an etching step. Then, the front surface electrode 50 is separated into the source electrode 51 and the gate portion 52 (i.e., the gate pad 52p and the gate interconnect line 52w).

In this process, the outer peripheral edge portion of the gate pad 52p is formed so as to be positioned on the inner side of the outer peripheral edge portion of the gate electrode 13 in the position taken along the line A-A' of FIG. 2. The outer peripheral edge portion of the gate pad 52p may be formed so as to be positioned on the inner side of the outer peripheral edge portion of the gate electrode 13 not only in the position taken along the line A-A' of FIG. 2 but also in all regions of the outer peripheral edge portion of the gate pad 52p.

Finally, a portion on the front surface electrode 50 is opened, and the front surface protective film 6 is formed so as to cover an edge portion of the front surface electrode 50 and at least a portion of the epitaxial substrate 30 in the outside region RO. This provides the MOSFET 100, as an example is shown in FIG. 1.

The front surface protective film 6 is processed into a desired shape, for example, by a polyimide coating step, a photolithography step, and an etching step. Alternatively, the front surface protective film 6 may be formed by depositing an SiN film by a CVD process and performing a photolithography step and an etching step.

As described above, the MOSFET 100 according to the present embodiment is capable of suppressing the production of aluminum hydroxide in the edge portion of the gate pad 52p in the termination region. Thus, cracking or separation of the gate pad 52p and the front surface protective film 6 is suppressed. This suppresses a leakage current increase and a gaseous discharge which result from the cracking or separation of the gate pad 52p and the front surface protective film 6 to thereby improve the insulation reliability of the MOSFET 100.

Second Embodiment

A semiconductor device and a method of manufacturing the semiconductor device according to a second embodiment will be described. In the following description, components similar to those described in the aforementioned embodiment are designated by and shown using the same reference numerals and characters, and will not be described in detail, as appropriate.

<Configuration of Semiconductor Device>

Figure 7:
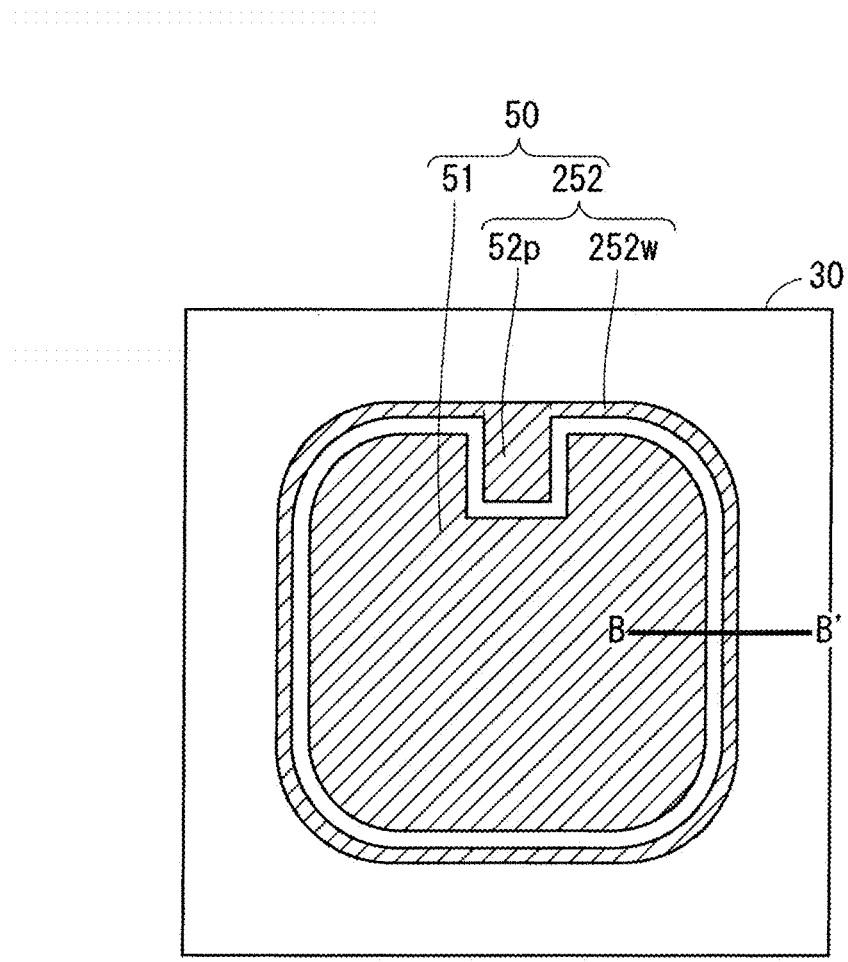
FIG. 7 is a plan view showing an example of the configuration of the MOSFET that is the semiconductor device according to another embodiment.

FIG. 7 is a plan view showing an example of the configuration of a MOSFET 200 that is the semiconductor device according to the present embodiment. FIG. 8 is a sectional view of the MOSFET 200. FIG. 8 corresponds to a section taken along a line B-B' in FIG. 7.

In the MOSFET 200 according to the present embodiment, a gate interconnect line 252w connected to the gate pad 52p is provided so as to surround the source electrode 51 as seen in plan view in the termination region (i.e., the outside region RO).

The gate interconnect line 252w is connected to the gate electrode 13 through a contact hole formed in an interlayer insulation film 314. The gate pad 52p may be provided in a corner portion (i.e., a bent portion of the gate interconnect line 252w as seen in plan view) of the termination region.

The outer peripheral edge portion of the gate electrode 13 is positioned between the outer peripheral edge portion of the gate pad 52p and the outer peripheral edge portion of the termination well region 2 in a region including the gate pad 52p in the MOSFET 200 according to the present embodiment, as in the MOSFET 100 of the first embodiment. Further, the outer peripheral edge portion of the gate electrode 13 is positioned between an outer peripheral edge portion of the gate interconnect line 252w and the outer peripheral edge portion of the termination well region 2 in a position taken along the line B-B' in FIG. 7. The outer peripheral edge portion of the gate electrode 13 may be positioned between the outer peripheral edge portion of the gate interconnect line 252w and the outer peripheral edge portion of the termination well region 2 not only in the position taken along the line B-B' in FIG. 7 but also in all regions of the outer peripheral edge portion of the gate interconnect line 252w.

In the present embodiment, the p type low-concentration well region 3 lower in impurity concentration than the termination well region 2 shown as an example in FIG. 4 may also be provided in the outer peripheral portion of the termination well region 2.

In the present embodiment, a contact hole may also be formed in the interlayer insulation film 314 in the position of the outermost periphery of the gate interconnect line 252w, like the gate pad 152p shown as an example in FIG. 5, and the gate interconnect line 252w and the gate electrode 13 may be connected to each other on the outermost periphery of the gate interconnect line 252w.

Other configurations are similar to those of the MOSFET 100 of the first embodiment.

<Operation of Semiconductor Device>

Next, an operation of the MOSFET 200 according to the present embodiment will be described.

As in the first embodiment, the MOSFET 200 according to the present embodiment operates in the two states: the ON state in which a positive voltage that is not less than a threshold value is applied to the gate electrode 13; and the OFF state in which a voltage that is less than the threshold value is applied to the gate electrode 13.

In a semiconductor device using a material such as SiC in which electric field strength is especially high in the OFF state, a high electric field is generated in an edge portion of an electrode material to result in destruction of the electrode material in some cases if the edge portion of the electrode material is positioned in a location where the upper surface of the epitaxial layer 32 is depleted. In the MOSFET 200 according to the present embodiment, the impurity concentration of the termination well region 2 is hence generally set to an impurity concentration that does not deplete the inside of the termination well region 2 under the gate electrode 13, the gate pad 52p, and the gate interconnect line 252w.

An instance in which the MOSFET 200 is in the OFF state under conditions of high humidity will now be considered. An encapsulation resin provided so as to cover a semiconductor chip can contain moisture. For example, when the front surface protective film 6 is made of a resin material with high water absorbency such as polyimide, the front surface protective film 6 contains much moisture under the conditions of high humidity, so that there is apprehension that the moisture reaches the upper surfaces of the epitaxial layer 32, the gate pad 52p, and the gate interconnect line 252w. Even when the front surface protective film 6 is made of a highly moisture-resistant material such as SiN, cracks are prone to appear in the front surface protective film 6 due to stresses generated during the process, so that there is apprehension that the epitaxial layer 32, the gate pad 52p, and the gate interconnect line 252w are exposed to moisture through the cracks.

In such a state, the voltage applied to the MOSFET 200 that is in the OFF state causes an edge portion of the epitaxial layer 32 to act as an anode and causes a gate portion 252 (the gate pad 52p and the gate interconnect line 252w) to act as a cathode in the termination region. Further, when a negative voltage is applied to the gate portion 252 (the gate pad 52p and the gate interconnect line 252w) with respect to the source electrode 51, the gate portion 252 (the gate pad 52p and the gate interconnect line 252w) acts as a cathode for the source electrode 51 and the termination well region 2 connected to the source electrode 51. The concentration of hydroxide ions increases in the vicinity of the gate portion 252 (the gate pad 52p and the gate interconnect line 252w) acting as the cathode, as in the first embodiment. The hydroxide ions react chemically with the gate portion 252 (the gate pad 52p and the gate interconnect line 252w). For example, if the gate portion 252 (the gate pad 52p and the gate interconnect line 252w) is composed of aluminum, there are cases in which the aforementioned chemical reactions cause the aluminum to become aluminum hydroxide.

The reaction between aluminum and hydroxide ions is accelerated in accordance with the electric field strength of the surroundings. A potential gradient is generated in a depleted region inside a semiconductor layer. For this reason, a potential gradient along the upper surface S2 is generated in a region where a depletion layer reaches the upper surface of the epitaxial substrate 30 in the MOSFET 200 according to the present embodiment. An electric field is generated around an edge portion of the gate portion 252 (the gate pad 52p and the gate interconnect line 252w) because this potential gradient is carried over to the field insulation film 4 and the interlayer insulation film 314 which are formed on the upper surface S2 of the epitaxial layer 32. When electric field strength in the edge portion of the gate portion 252 (the gate pad 52p and the gate interconnect line 252w) hence reaches a certain level or above, an aluminum hydroxide production reaction occurs, and the reaction is accelerated with the increase in electric field strength.

When a negative voltage is applied to the gate portion 252 (the gate pad 52p and the gate interconnect line 252w) with respect to the source electrode 51, electric field strength under the gate portion 252 (the gate pad 52p and the gate interconnect line 252w) increases due to a potential difference between the gate portion 252 (the gate pad 52p and the gate interconnect line 252w) and the termination well region 2. In particular, electric field concentration is prone to occur in an outer peripheral edge portion under the gate pad 52p, so that the production of aluminum hydroxide is accelerated.

When aluminum hydroxide is produced on the front surface of the gate portion 252 (the gate pad 52p and the gate interconnect line 252w) as described above, volume expansion causes cracking or separation of the gate pad 52p, the gate interconnect line 252w, and the front surface protective film 6 to create cavities on the upper surface of the interlayer insulation film 314. Moisture enters the cavities to cause an excessive leakage current flow or a gaseous discharge in the cavities, thereby resulting in the apprehension of device breakdown of the MOSFET 200.

In the MOSFET 200 according to the present embodiment, on the other hand, the outer peripheral edge portion of the gate portion 252 (the gate pad 52p and the gate interconnect line 252w) is on the inner side of the outer peripheral edge portion of the termination well region 2, as in the MOSFET 100 of the first embodiment. This mitigates the electric field strength around the gate portion 252 (the gate pad 52p and the gate interconnect line 252w).

If the impurity concentration of the termination well region 2 is not less than a predetermined level, the depletion layer will hardly extend to the inside of the termination well region 2. This effectively mitigates the electric field strength around the gate portion 252 (the gate pad 52p and the gate interconnect line 252w) to thereby effectively suppress the production of aluminum hydroxide.

Further, as an example is shown in FIG. 4, the provision of the low-concentration well region 3 in the outer peripheral portion of the termination well region 2 effectively mitigates the electric field strength around the gate portion 252 (the gate pad 52p and the gate interconnect line 252w) and also mitigates the electric field strength of the epitaxial layer 32 around the outer peripheral edge portion of the termination well region 2. This increases the avalanche voltage of the MOSFET 200.

In the MOSFET 200 according to the present embodiment, the outer peripheral edge portion of the gate electrode 13 is on the outer side of the outer peripheral edge portion of the gate pad 52p, as in the MOSFET 100 of the first embodiment. In addition, the outer peripheral edge portion of the gate electrode 13 is on the outer side of the outer peripheral edge portion of the gate interconnect line 252w in the position taken along the line B-B' of FIG. 7.

When a negative voltage is applied to the gate portion 252 (the gate pad 52p and the gate interconnect line 252w) with respect to the source electrode 51, the potential difference between the gate portion 252 (the gate pad 52p and the gate interconnect line 252w) and the termination well region 2 is generated only inside the field insulation film 4 under the gate electrode 13 in a region where the gate electrode 13 is provided between the gate portion 252 (the gate pad 52p and the gate interconnect line 252w) and the termination well region 2. This mitigates the electric field strength around the gate portion 252 (the gate pad 52p and the gate interconnect line 252w).

Thus, in the MOSFET 200 according to the present embodiment, the gate electrode 13 is present under the outer peripheral edge portion of the gate portion 252 (the gate pad 52p and the gate interconnect line 252w) where the electric field concentration is especially prone to occur. This mitigates the electric field concentration in the outer peripheral edge portion under the gate portion 252 (the gate pad 52p and the gate interconnect line 252w) to suppress the production of aluminum hydroxide.

When the outer peripheral edge portion of the gate electrode 13 is positioned between the outer peripheral edge portion of the gate interconnect line 252w and the outer peripheral edge portion of the termination well region 2 not only in the position taken along the line B-B' of FIG. 7 but also in all regions of the outer peripheral edge portion of the gate interconnect line 252w, the electric field concentration is mitigated in all regions of the outer peripheral edge portion under the gate interconnect line 252w, so that the production of aluminum hydroxide is suppressed.

As an example is shown in FIG. 5, the contact hole is formed in the interlayer insulation film 314 in the position of the outermost periphery of the gate pad 52p and the gate interconnect line 252w, so that the gate pad 52p and the gate interconnect line 252w are connected to the gate electrode 13 through the contact hole on the outermost periphery of the gate pad 52p and the gate interconnect line 252w. This sufficiently suppresses the electric field concentration in the outer peripheral edge portion under the gate pad 52p and the gate interconnect line 252w to suppress the production of aluminum hydroxide.

As described above, the production of aluminum hydroxide in the edge portion of the gate portion 252 (the gate pad 52p and the gate interconnect line 252w) is suppressed in the MOSFET 200 according to the present embodiment. As a result, this suppresses a leakage current increase and a gaseous discharge which result from cracking or separation of the gate portion 252 and the front surface protective film 6.

<Method of Manufacturing Semiconductor Device>

Next, a method of manufacturing the MOSFET 200 as a semiconductor device according to the present embodiment will be described.

Like the MOSFET 100 of the first embodiment, the MOSFET 200 according to the present embodiment is also manufactured by repeating a photolithography step in which a resist mask is formed, an ion implantation step in which ion implantation is performed using the resist mask as an implantation mask, a deposition step, and an etching step.

In the MOSFET 200 according to the present embodiment, the front surface electrode 50 is patterned to separate into the source electrode 51 and the gate portion 252 (the gate pad 52p and the gate interconnect line 252w) so that the outer peripheral edge portion of the gate pad 52p is positioned on the inner side of the outer peripheral edge portion of the gate electrode 13. Further, the outer peripheral edge portion of the gate interconnect line 252w is formed so as to be positioned on the inner side of the outer peripheral edge portion of the gate electrode 13 in the position taken along the line B-B' of FIG. 7. The outer peripheral edge portion of the gate interconnect line 252w may be formed so as to be positioned on the inner side of the outer peripheral edge portion of the gate electrode 13 not only in the position taken along the line B-B' of FIG. 7 but also in all regions of the outer peripheral edge portion of the gate interconnect line 252w.

Other steps are similar to those for the MOSFET 100 of the first embodiment.

As described above, the MOSFET 200 according to the present embodiment is capable of suppressing the production of aluminum hydroxide in the edge portion of the gate portion 252 (the gate pad 52p and the gate interconnect line 252w) in the termination region. Thus, cracking or separation of the gate pad 52p, the gate interconnect line 252w, and the front surface protective film 6 is suppressed. This suppresses a leakage current increase and a gaseous discharge which result from the cracking or separation of the gate pad 52p, the gate interconnect line 252w, and the front surface protective film 6 to thereby improve the insulation reliability of the MOSFET 200.

Third Embodiment

Figure 9:
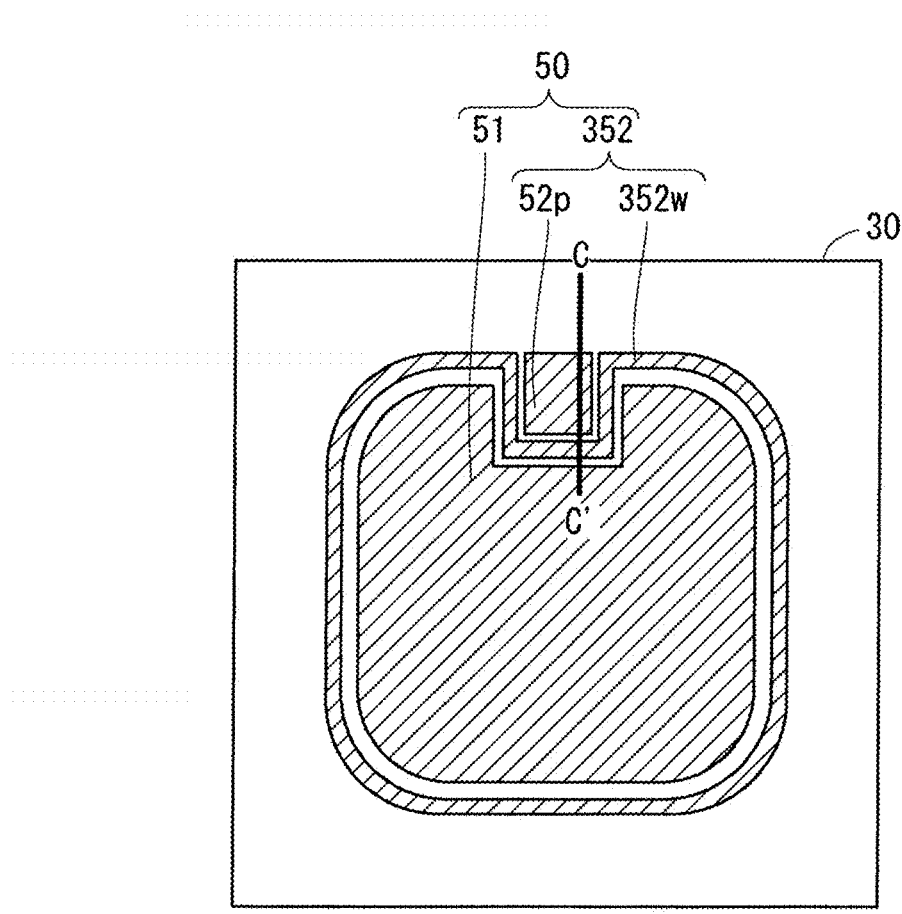
FIG. 9 is a plan view showing an example of the configuration of the MOSFET that is the semiconductor device according to another embodiment.
Figure 10:
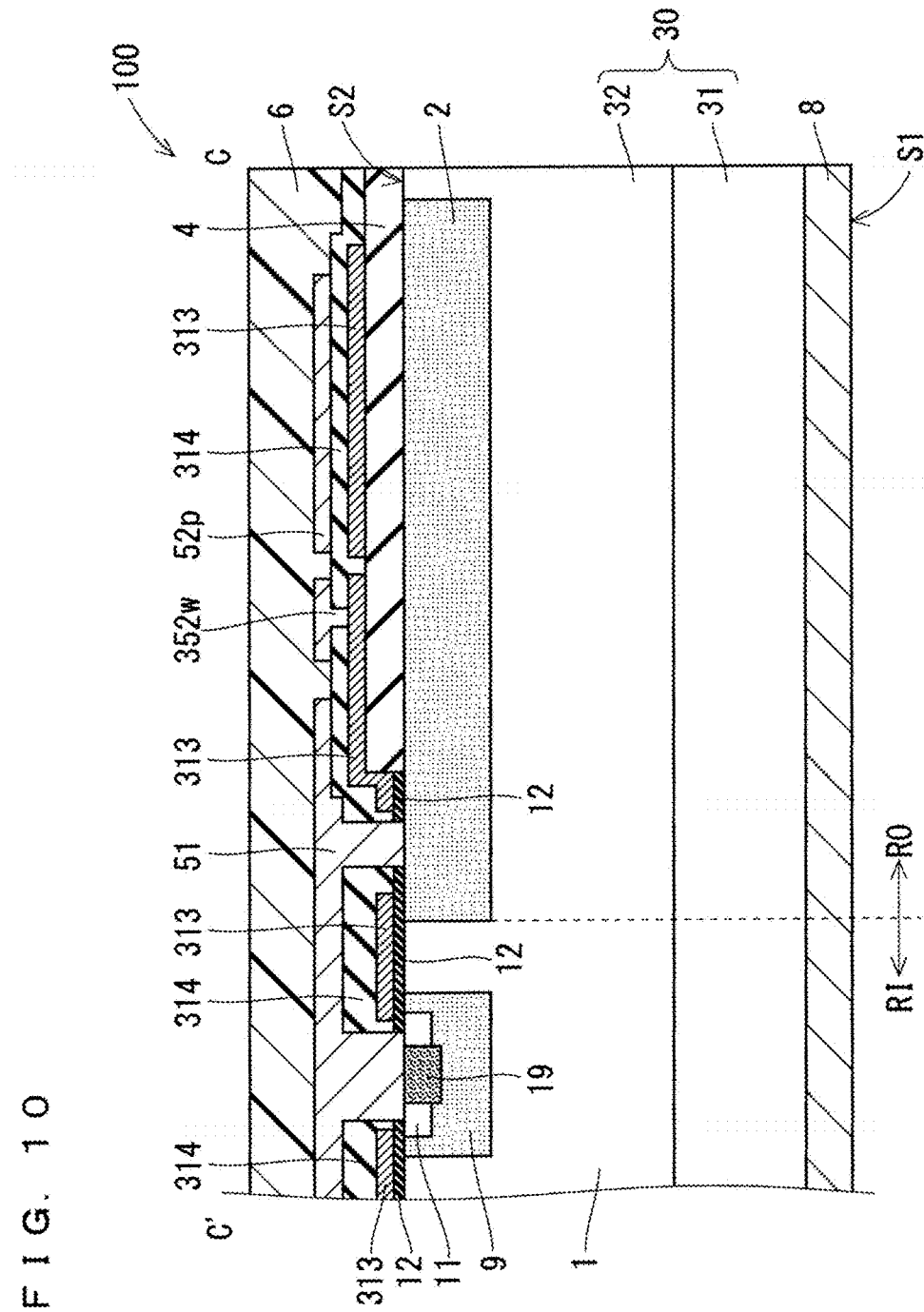
FIG. 10 is a sectional view of the MOSFET.

A semiconductor device and a method of manufacturing the semiconductor device according to a third embodiment will be described. In the following description, components similar to those described in the aforementioned embodiments are designated by and shown using the same reference numerals and characters, and will not be described in detail, as appropriate.
<Configuration of Semiconductor Device>
FIG. 9 is a plan view showing an example of the configuration of a MOSFET 300 that is the semiconductor device according to the present embodiment. FIG. 10 is a sectional view of the MOSFET 300. FIG. 10 corresponds to a section taken along a line C-C' in FIG. 9.

In the MOSFET 300 according to the present embodiment, a gate interconnect line 352w is provided in spaced apart relation to the gate pad 52p so as to be partially surrounded by the source electrode 51 (so as to enter a region surrounded by a region in which the source electrode 51 is formed in the same manner as the gate pad 52p) as seen in plan view in the termination region (i.e., the outside region RO).

The gate interconnect line 352w is connected to a gate electrode 313 through a contact hole formed in the interlayer insulation film 314. The gate electrode 313 is partially open in a region lying between the gate pad 52p and the gate interconnect line 352w.

The gate electrode 313 is not connected to the gate pad 52p in a position taken along the line C-C' in FIG. 9 in the termination region. The gate electrode 313 electrically connects the gate pad 52p and the gate interconnect line 352w through a contact hole formed in the interlayer insulation film 314 in a portion of the termination region other than the position taken along the line C-C' in FIG. 9. The gate pad 52p may be provided in a corner portion (i.e., a bent portion of the gate interconnect line 352w as seen in plan view) of the termination region.

In the termination region, a portion of the gate electrode 313 may be separated and connected to the gate pad 52p and the gate interconnect line 352w through a contact hole formed in the interlayer insulation film 314. In this case, the gate electrode 313 in the unit cell UC extends to the termination region, but is connected only to the gate interconnect line 352w without being connected to the gate pad 52p.

An outer peripheral edge portion of the gate electrode 313 is positioned between the outer peripheral edge portion of the gate pad 52p and the outer peripheral edge portion of the termination well region 2 in the position taken along the line C-C' in FIG. 9 in the MOSFET 300 according to the present embodiment, as in the MOSFET 100 of the first embodiment. Further, the outer peripheral edge portion of the gate electrode 313 is positioned between an outer peripheral edge portion of the gate interconnect line 352w and the outer peripheral edge portion of the termination well region 2 in a region where the gate pad 52p is not formed, as in the MOSFET 200 of the second embodiment.

The outer peripheral edge portion of the gate electrode 313 may be positioned between the outer peripheral edge portion of the gate pad 52p and the outer peripheral edge portion of the termination well region 2 not only in the position taken along the line C-C' in FIG. 9 but also in all regions of the outer peripheral edge portion of the gate pad 52p. In the region where the gate pad 52p is not formed, the outer peripheral edge portion of the gate electrode 313 may also be positioned between the outer peripheral edge portion of the gate interconnect line 352w and the outer peripheral edge portion of the termination well region 2 in all regions of the outer peripheral edge portion of the gate interconnect line 352w.

The gate electrode 313 positioned under the outer peripheral edge portion of the gate pad 52p may extend from a region connected to the gate pad 52p or from a region connected to the gate interconnect line 352w.

In the present embodiment, the p type low-concentration well region 3 lower in impurity concentration than the termination well region 2 shown as an example in FIG. 4 may also be provided in the outer peripheral portion of the termination well region 2.

In the present embodiment, a contact hole may also be formed in the interlayer insulation film 314 in the position of the outermost periphery of the gate pad 52p and the gate interconnect line 352w, like the gate pad 52p shown as an example in FIG. 5, and the gate pad 52p and the gate interconnect line 352w may be connected to the gate electrode 313 on the outermost periphery of the gate pad 52p and the gate interconnect line 352w.

Like the gate electrode 113 shown as an example in FIG. 6, the gate electrode 313 need not necessarily be provided in the entire region lying under the gate pad 52p.

Other configurations are similar to those of the MOSFET 200 of the second embodiment.
<Operation of Semiconductor Device>
Next, an operation of the MOSFET 300 according to the present embodiment will be described.

As in the first and second embodiments, the MOSFET 300 according to the present embodiment operates in the two states: the ON state in which a positive voltage that is not less than a threshold value is applied to the gate electrode 313; and the OFF state in which a voltage that is less than the threshold value is applied to the gate electrode 313.

In the MOSFET 300 according to the present embodiment, the gate electrode 313 is partially open in a region lying between the gate pad 52p and the gate interconnect line 352w. Thus, the gate electrode 313 electrically connecting the gate pad 52p and the gate interconnect line 352w through a contact hole is present only in a portion around the gate pad 52p. In other words, the MOSFET 300 according to the present embodiment incorporates a parasitic gate resistor made by the gate electrode 313, which in turn suppresses self-oscillation during switching between the ON and OFF states. The resistance of such a parasitic gate resistor is controllable by changing the shape of the gate electrode 313 that electrically connects the gate pad 52p and the gate interconnect line 352w through the contact hole.

In a semiconductor device using a material such as SiC in which electric field strength is especially high in the OFF state, a high electric field is generated in an edge portion of an electrode material to result in destruction of the electrode material in some cases if the edge portion of the electrode material is positioned in a location where the upper surface of the epitaxial layer 32 is depleted. In the MOSFET 300 according to the present embodiment, the impurity concentration of the termination well region 2 is hence generally set to an impurity concentration that does not deplete the inside of the termination well region 2 under the gate electrode 313, the gate pad 52$p$, and the gate interconnect line 352$w$.

An instance in which the MOSFET 300 is in the OFF state under conditions of high humidity will now be considered. An encapsulation resin provided so as to cover a semiconductor chip can contain moisture. For example, when the front surface protective film 6 is made of a resin material with high water absorbency such as polyimide, the front surface protective film 6 contains much moisture under the conditions of high humidity, so that there is apprehension that the moisture reaches the upper surfaces of the epitaxial layer 32, the gate pad 52$p$, and the gate interconnect line 352$w$. Even when the front surface protective film 6 is made of a highly moisture-resistant material such as SiN, cracks are prone to appear in the front surface protective film 6 due to stresses generated during the process, so that there is apprehension that the epitaxial layer 32, the gate pad 52$p$, and the gate interconnect line 352$w$ are exposed to moisture through the cracks.

In such a state, the voltage applied to the MOSFET 300 that is in the OFF state causes an edge portion of the epitaxial layer 32 to act as an anode and causes a gate portion 352 (the gate pad 52$p$ and the gate interconnect line 352$w$) to act as a cathode in the termination region. Further, when a negative voltage is applied to the gate portion 352 (the gate pad 52$p$ and the gate interconnect line 352$w$) with respect to the source electrode 51, the gate portion 352 (the gate pad 52$p$ and the gate interconnect line 352$w$) acts as a cathode for the source electrode 51 and the termination well region 2 connected to the source electrode 51. The concentration of hydroxide ions increases in the vicinity of the gate portion 352 (the gate pad 52$p$ and the gate interconnect line 352$w$) acting as the cathode, as in the first embodiment. The hydroxide ions react chemically with the gate portion 352 (the gate pad 52$p$ and the gate interconnect line 352$w$). For example, if the gate portion 352 (the gate pad 52$p$ and the gate interconnect line 352$w$) is composed of aluminum, there are cases in which the aforementioned chemical reactions cause the aluminum to become aluminum hydroxide.

The reaction between aluminum and hydroxide ions is accelerated in accordance with the electric field strength of the surroundings. A potential gradient is generated in a depleted region inside a semiconductor layer. For this reason, a potential gradient along the upper surface S2 is generated in a region where a depletion layer reaches the upper surface of the epitaxial substrate 30 in the MOSFET 300 according to the present embodiment. An electric field is generated around an edge portion of the gate portion 352 (the gate pad 52$p$ and the gate interconnect line 352$w$) because this potential gradient is carried over to the field insulation film 4 and the interlayer insulation film 314 which are formed on the upper surface S2 of the epitaxial layer 32. When electric field strength in the edge portion of the gate portion 352 (the gate pad 52$p$ and the gate interconnect line 352$w$) hence reaches a certain level or above, an aluminum hydroxide production reaction occurs, and the reaction is accelerated with the increase in electric field strength.

When a negative voltage is applied to the gate portion 352 (the gate pad 52$p$ and the gate interconnect line 352$w$) with respect to the source electrode 51, electric field strength under the gate portion 352 (the gate pad 52$p$ and the gate interconnect line 352$w$) increases due to a potential difference between the gate portion 352 (the gate pad 52$p$ and the gate interconnect line 352$w$) and the termination well region 2. When fluctuations in gate voltage or a sudden change in drain voltage occurs due to the self-oscillation during the switching, the electric field strength under the gate portion 352 (the gate pad 52$p$ and the gate interconnect line 352$w$) increases. In particular, electric field concentration is prone to occur in an outer peripheral edge portion under the gate portion 352 (the gate pad 52$p$ and the gate interconnect line 352$w$), so that the production of aluminum hydroxide is accelerated.

When aluminum hydroxide is produced on the front surface of the gate portion 352 (the gate pad 52$p$ and the gate interconnect line 352$w$) as described above, volume expansion causes cracking or separation of the gate pad 52$p$, the gate interconnect line 352$w$, and the front surface protective film 6 to create cavities on the upper surface of the interlayer insulation film 314. Moisture enters the cavities to cause an excessive leakage current flow or a gaseous discharge in the cavities, thereby resulting in the apprehension of device breakdown of the MOSFET 300.

In the MOSFET 300 according to the present embodiment, on the other hand, the outer peripheral edge portion of the gate portion 352 (the gate pad 52$p$ and the gate interconnect line 352$w$) is on the inner side of the outer peripheral edge portion of the termination well region 2, as in the MOSFET 200 of the second embodiment. This mitigates the electric field strength around the gate portion 352 (the gate pad 52$p$ and the gate interconnect line 352$w$).

If the impurity concentration of the termination well region 2 is not less than a predetermined level, the depletion layer will hardly extend to the inside of the termination well region 2. This effectively mitigates the electric field strength around the gate portion 352 (the gate pad 52$p$ and the gate interconnect line 352$w$) to thereby effectively suppress the production of aluminum hydroxide.

The MOSFET 300 according to the present embodiment incorporates the parasitic gate resistor. Thus, the parasitic gate resistor suppresses the self-oscillation during switching between the ON and OFF states to suppress the electric field concentration around the gate portion 352 (the gate pad 52$p$ and the gate interconnect line 352$w$) resulting from the fluctuations in gate voltage or the sudden change in drain voltage, thereby suppressing the production of aluminum hydroxide.

Further, as an example is shown in FIG. 4, the provision of the low-concentration well region 3 in the outer peripheral portion of the termination well region 2 effectively mitigates the electric field strength around the gate portion 352 (the gate pad 52$p$ and the gate interconnect line 352$w$) and also mitigates the electric field strength of the epitaxial layer 32 around the outer peripheral edge portion of the termination well region 2. This increases the avalanche voltage of the MOSFET 300.

In the MOSFET 300 according to the present embodiment, the outer peripheral edge portion of the gate electrode 313 is on the outer side of the outer peripheral edge portion of the gate pad 52$p$ in the position taken along the line C-C' in FIG. 9, as in the MOSFET 100 of the first embodiment. In addition, the outer peripheral edge portion of the gate electrode 313 is on the outer side of the outer peripheral edge portion of the gate interconnect line 352$w$ in the region where the gate pad 52$p$ is not formed.

When a negative voltage is applied to the gate portion 352 (the gate pad 52$p$ and the gate interconnect line 352$w$) with respect to the source electrode 51, the potential difference between the gate portion 352 (the gate pad 52$p$ and the gate interconnect line 352w) and the termination well region 2 is generated only inside the field insulation film 4 under the gate electrode 313 in a region where the gate electrode 313 is provided between the gate portion 352 (the gate pad 52p and the gate interconnect line 352w) and the termination well region 2. This mitigates the electric field strength around the gate portion 352 (the gate pad 52p and the gate interconnect line 352w).

Thus, in the MOSFET 300 according to the present embodiment, the gate electrode 313 is present under the outer peripheral edge portion of the gate portion 352 (the gate pad 52p and the gate interconnect line 352w) where the electric field concentration is especially prone to occur. This mitigates the electric field concentration in the outer peripheral edge portion under the gate portion 352 (the gate pad 52p and the gate interconnect line 352w) to suppress the production of aluminum hydroxide.

On the other hand, if the gate electrode 313 is not provided between the gate pad 52p and the termination well region 2, the potential difference between the gate pad 52p and the termination well region 2 is shared by the field insulation film 4 and the interlayer insulation film 314. Thus, the electric field strength inside the field insulation film 4 is mitigated. This suppresses the reduction in yield due to intruding dust or the like during the manufacture of the MOSFET 300.

The gate electrode 313 is partially opened under the gate pad 52p except in a region where the gate electrode 313 is formed in a position that straddles the outer peripheral edge portion of the gate pad 52p as seen in plan view. This mitigates the electric field concentration in the outer peripheral edge portion under the gate pad 52p where the electric field concentration is especially prone to occur to suppress the reduction in yield.

When the outer peripheral edge portion of the gate electrode 313 is positioned between the outer peripheral edge portion of the gate pad 52p and the outer peripheral edge portion of the termination well region 2 not only in the position taken along the line C-C' of FIG. 9 but also in all regions of the outer peripheral edge portion of the gate pad 52p, the electric field concentration is mitigated in all regions of the outer peripheral edge portion under the gate pad 52p, so that the production of aluminum hydroxide is suppressed. Similarly, when the outer peripheral edge portion of the gate electrode 313 is positioned between the outer peripheral edge portion of the gate interconnect line 352w and the outer peripheral edge portion of the termination well region 2 in all regions of the outer peripheral edge portion of the gate interconnect line 352w in the region where the gate pad 52p is not formed, the electric field concentration is mitigated in all regions of the outer peripheral edge portion under the gate interconnect line 352w, so that the production of aluminum hydroxide is suppressed.

As an example is shown in FIG. 5, the contact hole is formed in the interlayer insulation film 314 in the position of the outermost periphery of the gate pad 52p and the gate interconnect line 352w, so that the gate pad 52p and the gate interconnect line 352w are connected to the gate electrode 313 through the contact hole on the outermost periphery of the gate pad 52p and the gate interconnect line 352w. This sufficiently suppresses the electric field concentration in the outer peripheral edge portion under the gate pad 52p and the gate interconnect line 352w to suppress the production of aluminum hydroxide.

As described above, the production of aluminum hydroxide in the edge portion of the gate pad 52p and the gate interconnect line 352w in the region where the gate pad 52p is not formed is suppressed in the MOSFET 300 according to the present embodiment. As a result, this suppresses a leakage current increase and a gaseous discharge which result from cracking or separation of the gate portion 352 and the front surface protective film 6.

<Method of Manufacturing Semiconductor Device>

Next, a method of manufacturing the MOSFET 300 as a semiconductor device according to the present embodiment will be described.

Like the MOSFETs 100 and 200 of the first and second embodiments, the MOSFET 300 according to the present embodiment is also manufactured by repeating a photolithography step in which a resist mask is formed, an ion implantation step in which ion implantation is performed using the resist mask as an implantation mask, a deposition step, and an etching step.

In the MOSFET 300 according to the present embodiment, the gate electrode 313 is partially open so as not to be formed in the region lying between the gate pad 52p and the gate interconnect line 352w. The gate electrode 313 is thus patterned. A portion of the gate electrode 313 may be separated in the termination region, and the gate electrode 313 in the unit cell UC may extend to the termination region and be connected only to the gate interconnect line 352w without being connected to the gate pad 52p. If the opening of the gate electrode 313 is formed to overlap at least one of the gate pad 52p and the gate interconnect line 352w, it is only necessary that a parasitic gate resistor is formed by making the gate electrode 313 thin.

In the MOSFET 300 according to the present embodiment, the front surface electrode 50 is patterned to separate into the source electrode 51 and the gate portion 352 (the gate pad 52p and the gate interconnect line 352w) so that the outer peripheral edge portion of the gate pad 52p is positioned on the inner side of the outer peripheral edge portion of the gate electrode 313 in the position taken along the line C-C' in FIG. 9. Further, the outer peripheral edge portion of the gate interconnect line 352w is formed so as to be positioned on the inner side of the outer peripheral edge portion of the gate electrode 313 in the region where the gate pad 52p is not formed. The outer peripheral edge portion of the gate pad 52p and the gate interconnect line 352w may be formed so as to be positioned on the inner side of the outer peripheral edge portion of the gate electrode 313 not only in the position taken along the line C-C' in FIG. 9 but also in all regions of the outer peripheral edge portion of the gate pad 52p and in all regions of the outer peripheral edge portion of the gate interconnect line 352w in the region where the gate pad 52p is not formed.

Other steps are similar to those for the MOSFET 100 of the first embodiment.

As described above, the MOSFET 300 according to the present embodiment is capable of suppressing the production of aluminum hydroxide in the edge portion of the gate portion 352 (the gate pad 52p and the gate interconnect line 352w) in the termination region. Thus, cracking or separation of the gate pad 52p, the gate interconnect line 352w, and the front surface protective film 6 is suppressed. This suppresses a leakage current increase and a gaseous discharge which result from the cracking or separation of the gate pad 52p, the gate interconnect line 352w, and the front surface protective film 6 to thereby improve the insulation reliability of the MOSFET 300.

Fourth Embodiment

A semiconductor device and a method of manufacturing the semiconductor device according to a fourth embodiment will be described. In the following description, components similar to those described in the aforementioned embodiments are designated by and shown using the same reference numerals and characters, and will not be described in detail, as appropriate.

<Configuration of Semiconductor Device>

Figure 11:
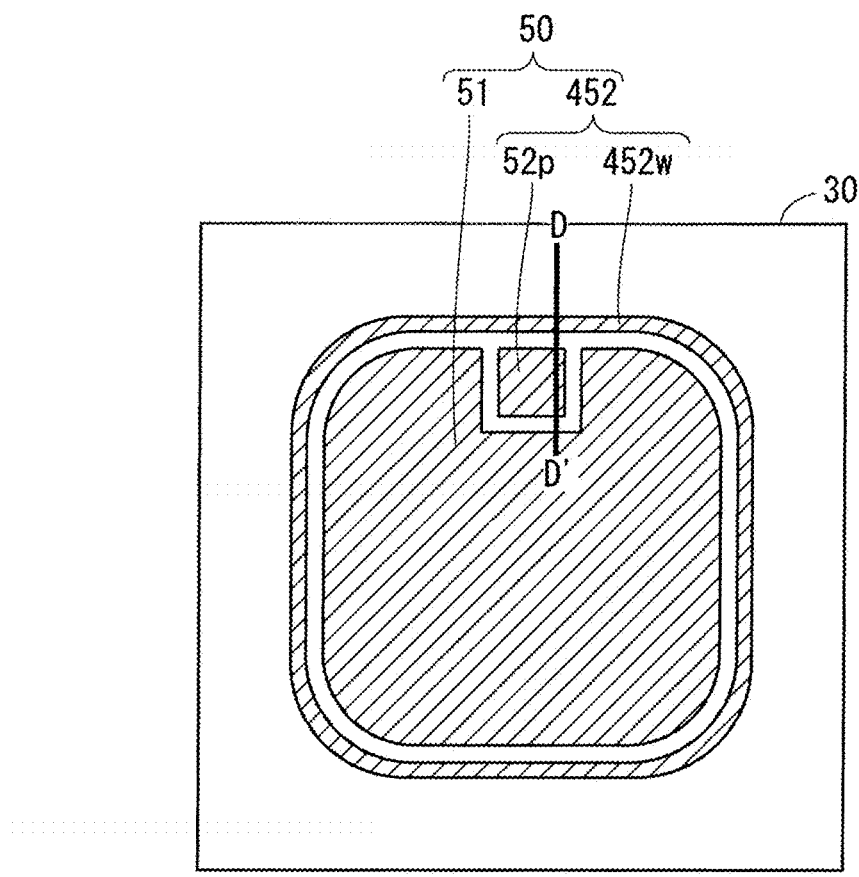
FIG. 11 is a plan view showing an example of the configuration of the MOSFET that is the semiconductor device according to another embodiment.
Figure 12:
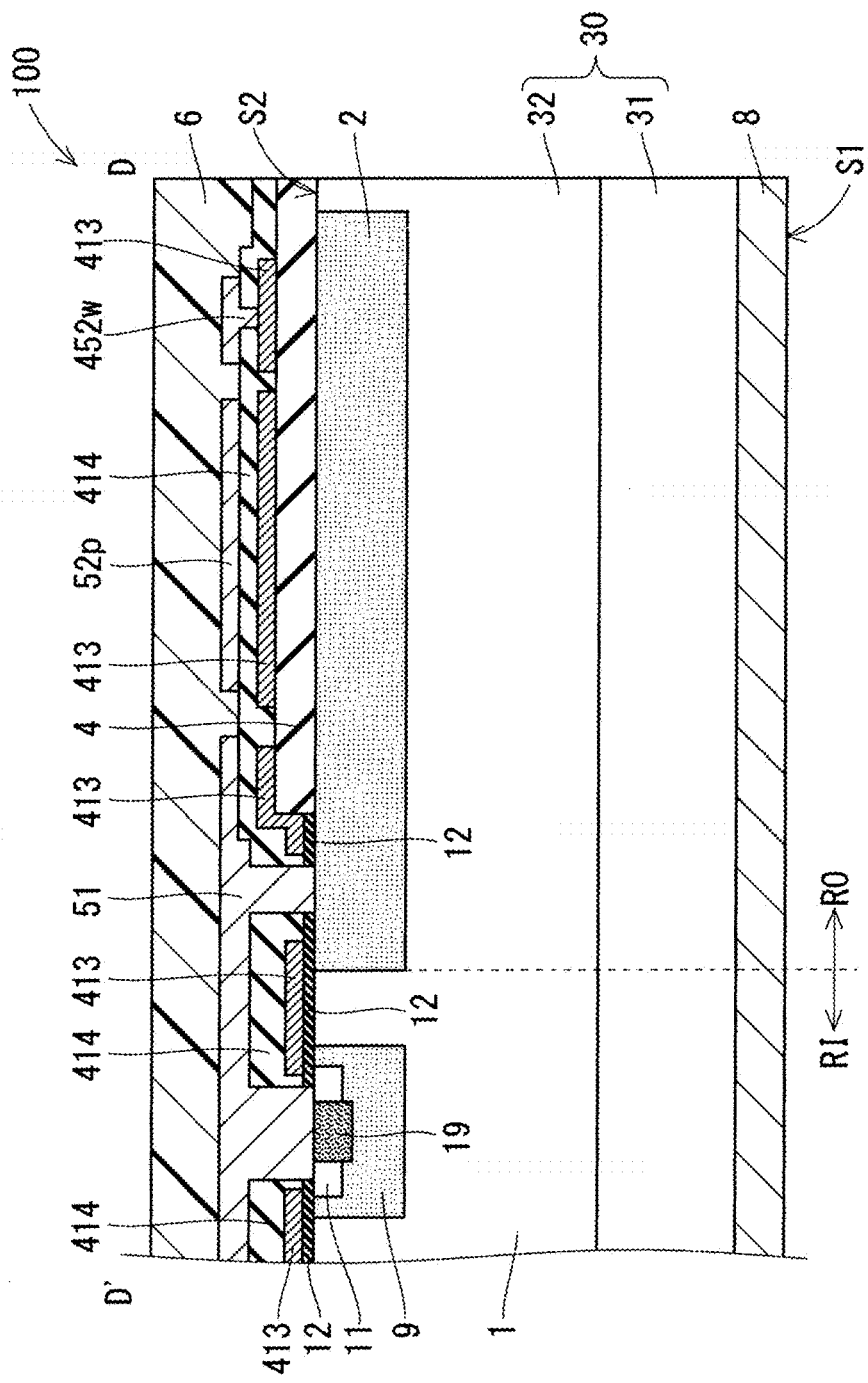
FIG. 12 is a sectional view of the MOSFET.

FIG. 11 is a plan view showing an example of the configuration of a MOSFET 400 that is the semiconductor device according to the present embodiment. FIG. 12 is a sectional view of the MOSFET 400. FIG. 12 corresponds to a section taken along a line D-D' in FIG. 11.

In the MOSFET 400 according to the present embodiment, a gate interconnect line 452w is provided in spaced apart relation to the gate pad 52p so as to surround the source electrode 51 and the gate pad 52p as seen in plan view in the termination region (i.e., the outside region RO).

The gate interconnect line 452w is connected to a gate electrode 413 through a contact hole formed in an interlayer insulation film 414. The gate electrode 413 is partially open in a region lying between the gate pad 52p and the gate interconnect line 452w.

The gate electrode 413 is not connected to the gate pad 52p in a position taken along the line D-D' in FIG. 11 in the termination region. The gate electrode 413 electrically connects the gate pad 52p and the gate interconnect line 452w through a contact hole formed in the interlayer insulation film 414 in a portion of the termination region other than the position taken along the line D-D' in FIG. 11. The gate pad 52p may be provided in a corner portion (i.e., a bent portion of the gate interconnect line 452w as seen in plan view) of the termination region.

In the termination region, a portion of the gate electrode 413 may be separated and connected to the gate pad 52p and the gate interconnect line 452w through a contact hole formed in the interlayer insulation film 414. In this case, the gate electrode 413 in the unit cell UC extends to the termination region, but is connected only to the gate interconnect line 452w without being connected to the gate pad 52p.

An outer peripheral edge portion of the gate electrode 413 is positioned between an outer peripheral edge portion of the gate interconnect line 452w and the outer peripheral edge portion of the termination well region 2 in the position taken along the line D-D' in FIG. 11 in the MOSFET 400 according to the present embodiment, as in the MOSFET 200 of the second embodiment.

The outer peripheral edge portion of the gate electrode 413 may be positioned between the outer peripheral edge portion of the gate interconnect line 452w and the outer peripheral edge portion of the termination well region 2 not only in the position taken along the line D-D' in FIG. 11 but also in all regions of the outer peripheral edge portion of the gate interconnect line 452w.

The gate electrode 413 positioned under the outer peripheral edge portion of the gate interconnect line 452w may extend from a region connected to the gate pad 52p or from a region connected to the gate interconnect line 452w.

In the present embodiment, the p type low-concentration well region 3 lower in impurity concentration than the termination well region 2 shown as an example in FIG. 4 may also be provided in the outer peripheral portion of the termination well region 2.

In the present embodiment, a contact hole may also be formed in the interlayer insulation film 414 in the position of the outermost periphery of the gate interconnect line 452w, like the gate pad 52p shown as an example in FIG. 5, and the gate interconnect line 452w and the gate electrode 413 may be connected to each other on the outermost periphery of the gate interconnect line 452w.

Like the gate electrode 113 shown as an example in FIG. 6, the gate electrode 413 need not necessarily be provided in the entire region lying under the gate pad 52p.

Other configurations are similar to those of the MOSFET 200 of the second embodiment.

<Operation of Semiconductor Device>

Next, an operation of the MOSFET 400 according to the present embodiment will be described.

As in the first, second, and third embodiments, the MOSFET 400 according to the present embodiment operates in the two states: the ON state in which a positive voltage that is not less than a threshold value is applied to the gate electrode 413; and the OFF state in which a voltage that is less than the threshold value is applied to the gate electrode 413.

In the MOSFET 400 according to the present embodiment, the gate electrode 413 is partially open in a region lying between the gate pad 52p and the gate interconnect line 42w, as in the MOSFET 300. Thus, the gate electrode 413 electrically connecting the gate pad 52p and the gate interconnect line 452w through a contact hole is present only in a portion around the gate pad 52p. In other words, the MOSFET 400 according to the present embodiment incorporates a parasitic gate resistor made by the gate electrode 413, which in turn suppresses self-oscillation during switching between the ON and OFF states. The resistance of such a parasitic gate resistor is controllable by changing the shape of the gate electrode 413 that electrically connects the gate pad 52p and the gate interconnect line 452w through the contact hole.

In a semiconductor device using a material such as SiC in which electric field strength is especially high in the OFF state, a high electric field is generated in an edge portion of an electrode material to result in destruction of the electrode material in some cases if the edge portion of the electrode material is positioned in a location where the upper surface of the epitaxial layer 32 is depleted. In the MOSFET 400 according to the present embodiment, the impurity concentration of the termination well region 2 is hence generally set to an impurity concentration that does not deplete the inside of the termination well region 2 under the gate electrode 413, the gate pad 52p, and the gate interconnect line 452w.

An instance in which the MOSFET 400 is in the OFF state under conditions of high humidity will now be considered. An encapsulation resin provided so as to cover a semiconductor chip can contain moisture. For example, when the front surface protective film 6 is made of a resin material with high water absorbency such as polyimide, the front surface protective film 6 contains much moisture under the conditions of high humidity, so that there is apprehension that the moisture reaches the upper surfaces of the epitaxial layer 32 and the gate interconnect line 452w. Even when the front surface protective film 6 is made of a highly moisture-resistant material such as SiN, cracks are prone to appear in the front surface protective film 6 due to stresses generated during the process, so that there is apprehension that the epitaxial layer 32 and the gate interconnect line 452w are exposed to moisture through the cracks.

In such a state, the voltage applied to the MOSFET 400 that is in the OFF state causes an edge portion of the epitaxial layer 32 to act as an anode and causes the gate interconnect line 452w to act as a cathode in the termination region. Further, when a negative voltage is applied to the gate interconnect line 452w with respect to the source electrode 51, the gate interconnect line 452w acts as a cathode for the source electrode 51 and the termination well region 2 connected to the source electrode 51. The concentration of hydroxide ions increases in the vicinity of the gate interconnect line 42w acting as the cathode, as in the first embodiment. The hydroxide ions react chemically with the gate interconnect line 452w. For example, if the gate interconnect line 452w is composed of aluminum, there are cases in which the aforementioned chemical reactions cause the aluminum to become aluminum hydroxide.

The reaction between aluminum and hydroxide ions is accelerated in accordance with the electric field strength of the surroundings. A potential gradient is generated in a depleted region inside a semiconductor layer. For this reason, a potential gradient along the upper surface S2 is generated in a region where a depletion layer reaches the upper surface of the epitaxial substrate 30 in the MOSFET 400 according to the present embodiment. An electric field is generated around an edge portion of the gate interconnect line 452w because this potential gradient is carried over to the field insulation film 4 and the interlayer insulation film 414 which are formed on the upper surface S2 of the epitaxial layer 32. When electric field strength in the edge portion of the gate interconnect line 452w hence reaches a certain level or above, an aluminum hydroxide production reaction occurs, and the reaction is accelerated with the increase in electric field strength.

When a negative voltage is applied to the gate interconnect line 452w with respect to the source electrode 51, electric field strength under the gate interconnect line 452w increases due to a potential difference between the gate interconnect line 452w and the termination well region 2. When fluctuations in gate voltage or a sudden change in drain voltage occurs due to the self-oscillation during the switching, the electric field strength under the gate interconnect line 452w increases. In particular, electric field concentration is prone to occur in an outer peripheral edge portion under the gate interconnect line 452w, so that the production of aluminum hydroxide is accelerated.

When aluminum hydroxide is produced on the front surface of the gate interconnect line 452w as described above, volume expansion causes cracking or separation of the gate interconnect line 452w and the front surface protective film 6 to create cavities on the upper surface of the interlayer insulation film 414. Moisture enters the cavities to cause an excessive leakage current flow or a gaseous discharge in the cavities, thereby resulting in the apprehension of device breakdown of the MOSFET 400.

In the MOSFET 400 according to the present embodiment, on the other hand, the outer peripheral edge portion of the gate interconnect line 452w is on the inner side of the outer peripheral edge portion of the termination well region 2, as in the MOSFET 200 of the second embodiment. This mitigates the electric field strength around the gate interconnect line 452w.

If the impurity concentration of the termination well region 2 is not less than a predetermined level, the depletion layer will hardly extend to the inside of the termination well region 2. This effectively mitigates the electric field strength around the gate interconnect line 452w to thereby effectively suppress the production of aluminum hydroxide.

The MOSFET 400 according to the present embodiment incorporates the parasitic gate resistor. Thus, the parasitic gate resistor suppresses the self-oscillation during switching between the ON and OFF states to suppress the electric field concentration around the gate interconnect line 452w resulting from the fluctuations in gate voltage or the sudden change in drain voltage, thereby suppressing the production of aluminum hydroxide.

Further, as an example is shown in FIG. 4, the provision of the low-concentration well region 3 in the outer peripheral portion of the termination well region 2 effectively mitigates the electric field strength around the gate interconnect line 452w and also mitigates the electric field strength of the epitaxial layer 32 around the outer peripheral edge portion of the termination well region 2. This increases the avalanche voltage of the MOSFET 400.

In the MOSFET 400 according to the present embodiment, the outer peripheral edge portion of the gate electrode 413 is on the outer side of the outer peripheral edge portion of the gate interconnect line 452w in the position taken along the line D-D' in FIG. 11, as in the MOSFET 200 of the second embodiment.

When a negative voltage is applied to the gate interconnect line 452w with respect to the source electrode 51, the potential difference between the gate interconnect line 452w and the termination well region 2 is generated only inside the field insulation film 4 under the gate electrode 413 in a region where the gate electrode 413 is provided between the gate interconnect line 452w and the termination well region 2. This mitigates the electric field strength around the gate interconnect line 452w.

Thus, in the MOSFET 400 according to the present embodiment, the gate electrode 413 is present under the outer peripheral edge portion of the gate interconnect line 452w where the electric field concentration is especially prone to occur. This mitigates the electric field concentration in the outer peripheral edge portion under the gate interconnect line 452w to suppress the production of aluminum hydroxide.

On the other hand, if the gate electrode 413 is not provided between the gate pad 52p and the termination well region 2, the potential difference between the gate pad 52p and the termination well region 2 is shared by the field insulation film 4 and the interlayer insulation film 414. Thus, the electric field strength inside the field insulation film 4 is mitigated. This suppresses the reduction in yield due to intruding dust or the like during the manufacture of the MOSFET 400.

The gate electrode 413 is partially open under the gate pad 52p except in a region where the gate electrode 413 is formed in a position that straddles the outer peripheral edge portion of the gate pad 52p as seen in plan view. This mitigates the electric field concentration in the outer peripheral edge portion under the gate pad 52p where the electric field concentration is especially prone to occur to suppress the reduction in yield.

When the outer peripheral edge portion of the gate electrode 413 is positioned between the outer peripheral edge portion of the gate interconnect line 452w and the outer peripheral edge portion of the termination well region 2 not only in the position taken along the line D-D' of FIG. 11 but also in all regions of the outer peripheral edge portion of the gate interconnect line 452w, the electric field concentration is mitigated in all regions of the outer peripheral edge portion under the gate interconnect line 452w, so that the production of aluminum hydroxide is suppressed.

As an example is shown in FIG. 5, the contact hole is formed in the interlayer insulation film 414 in the position of the outermost periphery of the gate interconnect line 452w, so that the gate interconnect line 452w and the gate electrode 413 are connected to each other on the outermost periphery of the gate interconnect line 452w. This sufficiently suppresses the electric field concentration in the outer peripheral edge portion under the gate interconnect line 452w to suppress the production of aluminum hydroxide.

As described above, the production of aluminum hydroxide in the edge portion of the gate interconnect line 452w is suppressed in the MOSFET 400 according to the present embodiment. As a result, this suppresses a leakage current increase and a gaseous discharge which result from cracking or separation of the gate interconnect line 452w and the front surface protective film 6.

<Method of Manufacturing Semiconductor Device>

Next, a method of manufacturing the MOSFET 400 as a semiconductor device according to the present embodiment will be described.

Like the MOSFETs 100, 200, and 300 of the first, second, and third embodiments, the MOSFET 400 according to the present embodiment is also manufactured by repeating a photolithography step in which a resist mask is formed, an ion implantation step in which ion implantation is performed using the resist mask as an implantation mask, a deposition step, and an etching step.

In the MOSFET 400 according to the present embodiment, the gate electrode 413 is partially open so as not to be formed in the region lying between the gate pad 52p and the gate interconnect line 452w. The gate electrode 413 is thus patterned. A portion of the gate electrode 413 may be separated in the termination region, and the gate electrode 413 in the unit cell UC may extend to the termination region and be connected only to the gate interconnect line 452w without being connected to the gate pad 52p. If the opening of the gate electrode 413 is formed to overlap at least one of the gate pad 52p and the gate interconnect line 452w, it is only necessary that a parasitic gate resistor is formed by making the gate electrode 413 thin.

In the MOSFET 400 according to the present embodiment, the front surface electrode 50 is patterned to separate into the source electrode 51 and a gate portion 452 (the gate pad 52p and the gate interconnect line 452w) so that the outer peripheral edge portion of the gate interconnect line 452w is positioned on the inner side of the outer peripheral edge portion of the gate electrode 413 in the position taken along the line D-D' in FIG. 11. The outer peripheral edge portion of the gate interconnect line 452w may be formed so as to be positioned on the inner side of the outer peripheral edge portion of the gate electrode 413 not only in the position taken along the line D-D' in FIG. 11 but also in all regions of the outer peripheral edge portion of the gate interconnect line 452w.

Other steps are similar to those for the MOSFET 100 of the first embodiment.

As described above, the MOSFET 400 according to the present embodiment is capable of suppressing the production of aluminum hydroxide in the edge portion of the gate interconnect line 452w in the termination region. Thus, cracking or separation of the gate interconnect line 452w and the front surface protective film 6 is suppressed. This suppresses a leakage current increase and a gaseous discharge which result from the cracking or separation of the gate interconnect line 452w and the front surface protective film 6 to thereby improve the insulation reliability of the MOSFET 400.

Fifth Embodiment

A power conversion device and a method of manufacturing the power conversion device according to a fifth embodiment will be described. In the following description, components similar to those described in the aforementioned embodiments are designated by and shown using the same reference numerals and characters, and will not be described in detail, as appropriate.

<Configuration of Power Conversion Device>

The present embodiment applies the semiconductor devices related to the aforementioned embodiments to a power conversion device. Although the power conversion device to which the semiconductor devices are applied is not limited to a specific application, an instance in which the semiconductor devices are applied to a three-phase inverter will be described below.

Figure 13:
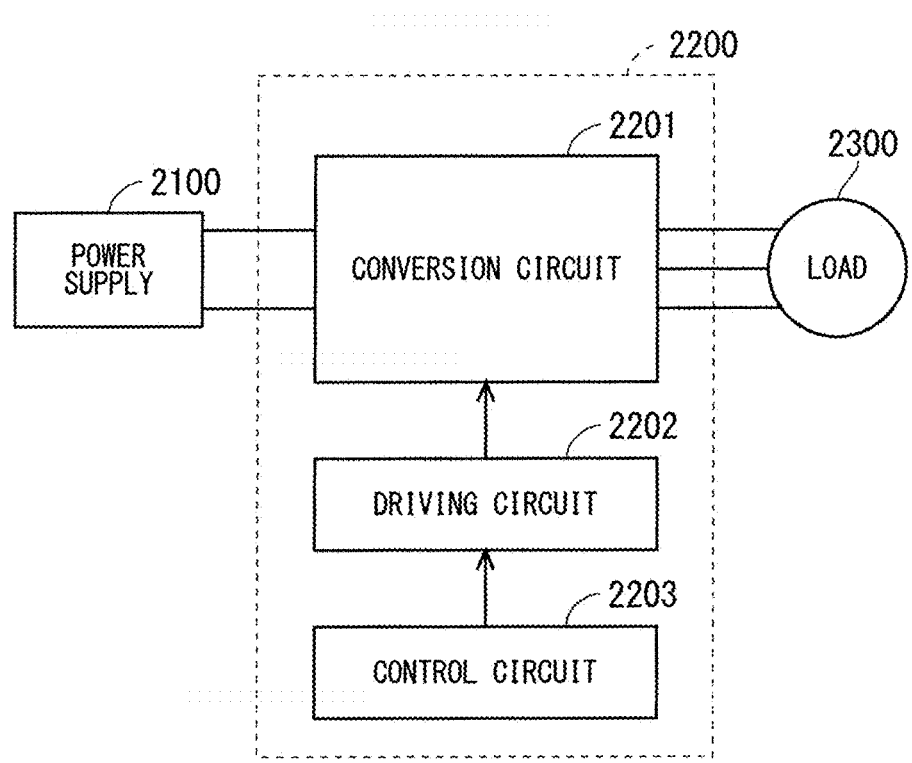
FIG. 13 is a diagram conceptually showing an example of the configuration of a power conversion system including a power conversion device of another embodiment.

FIG. 13 is a diagram conceptually showing an example of the configuration of a power conversion system including the power conversion device of the present embodiment.

As an example is shown in FIG. 13, the power conversion system includes a power supply 2100, a power conversion device 2200, and a load 2300. The power supply 2100 is a DC power supply, and supplies DC power to the power conversion device 2200. The power supply 2100 may be comprised of various equipment, e.g. a DC system, a solar cell, or a storage battery. The power supply 2100 may also be comprised of a rectifier circuit connected to an AC system, an AC-DC converter, or the like. The power supply 2100 may also be comprised of a DC-DC converter that converts DC power outputted from a DC system to predetermined electric power.

The power conversion device 2200 is a three-phase inverter connected between the power supply 2100 and the load 2300. The power conversion device 2200 converts the DC power supplied from the power supply 2100 to AC power, and further supplies the AC power to the load 2300.

As an example is shown in FIG. 13, the power conversion device 2200 includes: a conversion circuit 2201 that converts DC power to AC power to output the AC power; a driving circuit 2202 that outputs driving signals for driving switching elements of the conversion circuit 2201; and a control circuit 2203 that outputs a control signal for controlling the driving circuit 2202 to the driving circuit 2202.

The load 2300 is a three-phase electric motor driven by the AC power supplied from the power conversion device 2200. The load 2300 is not limited to a specific application, but is an electric motor for use in various types of electric equipment, for example, as an electric motor for hybrid vehicles, electric vehicles, railway vehicles, elevators, or air conditioning equipment.

Details on the power conversion device 2200 will be described hereinafter. The conversion circuit 2201 includes a switching element and a freewheeling diode (not shown). The switching element performs a switching operation to convert the DC power supplied from the power supply 2100 to AC power, and further supplies the AC power to the load 2300.

Although there are various specific circuit configurations for the conversion circuit 2201, the conversion circuit 2201 according to the present embodiment is a two-level, three-phase full-bridge circuit, and includes six switching elements and six freewheeling diodes connected in inverse-parallel to the respective switching elements.

The semiconductor device of any one of the aforementioned embodiments is applied to at least either the switching elements or the freewheeling diodes in the conversion circuit 2201. Every two of the six switching elements are connected in series to form upper and lower arms which in turn constitute each phase (i.e., U, V, and W phases) of the full-bridge circuit. The upper and lower arms has an output terminal (i.e., three output terminals of the conversion circuit 2201) connected to the load 2300.

The driving circuit 2202 generates the driving signals for driving the switching elements of the conversion circuit 2201, and supplies the driving signals to control electrodes of the switching elements of the conversion circuit 2201. Specifically, the driving circuit 2202 outputs driving signals for turning ON the switching elements and driving signals for turning OFF the switching elements to the control electrodes of the switching elements, based on the control signal outputted from the control circuit 2203 to be described later.

In maintaining the switching elements in the ON state, the driving signals are voltage signals (i.e., ON signals) of not less than a threshold voltage of the switching elements. In maintaining the switching elements in the OFF state, the driving signals are voltage signals (i.e., OFF signals) of less than the threshold voltage of the switching elements.

The control circuit 2203 controls the switching elements of the conversion circuit 2201 so that desired power is supplied to the load 2300. Specifically, the control circuit 2203 calculates the time that each of the switching elements of the conversion circuit 2201 should be in the ON state (i.e., ON time), based on the power to be supplied to the load 2300. For example, the control circuit 2203 is capable of controlling the conversion circuit 2201 by means of pulse width modulation (PWM) control which modulates the ON time of the switching elements in accordance with a voltage to be outputted.

The control circuit 2203 outputs a control command (i.e., the control signal) to the driving circuit 2202 so that the ON signal is outputted to a switching element that should be in the ON state and the OFF signal is outputted to a switching element that should be in the OFF state at each point in time. Based on the control signal, the driving circuit 2202 outputs the ON signals or the OFF signals as the driving signals to the control electrodes of the switching elements.

The power conversion device 2200 according to the present embodiment is capable of stabilizing an ON-state resistance after an energizing cycle because the semiconductor device of any one of the aforementioned embodiments is applied to the switching elements of the conversion circuit 2201.

In the power conversion device 2200 according to the present embodiment, the semiconductor devices of the aforementioned embodiments are applicable as the freewheeling diodes of the conversion circuit 2201.

In the case where the semiconductor devices according to the aforementioned embodiments are thus applied to the power conversion device 2200, the semiconductor devices are usually embedded in gel or resin when in use. However, these encapsulant materials cannot completely block out moisture. It is hence important that the insulation protection of the semiconductor devices is maintained by the configurations shown in the aforementioned embodiments. The semiconductor devices having the configurations shown in the aforementioned embodiments are applied, whereby the reliability of the power conversion device 2200 is improved.

An example in which the semiconductor device of any one of the aforementioned embodiments is applied to the two-level, three-phase inverter is described in the present embodiment, but examples of application are not limited to this. The semiconductor device of any one of the aforementioned embodiments may be applied to a variety of power conversion devices.

Although the two-level power conversion device is described in the present embodiment, the semiconductor device of any one of the aforementioned embodiments may be applied to a three-level or multi-level power conversion device. When supplying power to a single-phase load, the semiconductor device of any one of the aforementioned embodiments may be applied to a single-phase inverter.

When supplying power to a DC load or the like, the semiconductor device of any one of the aforementioned embodiments may also be applied to a DC-DC converter or an AC-DC converter.

The power conversion device to which the semiconductor device of any one of the aforementioned embodiments is applied is not limited to an instance where the aforementioned load is an electric motor, but may also be used, for example, as a power supply device for an electrical discharge machine, a laser beam machine, an induction heating cooker, or a non-contact power feeding system. The power conversion device to which the semiconductor device of any one of the aforementioned embodiments is applied may also be used as a power conditioner in a photovoltaic power generation system or a power storage system.

<Method of Manufacturing Power Conversion Device>

Next, a method of manufacturing the power conversion device according to the present embodiment will be described.

First, a semiconductor device is manufactured using the manufacturing method described in the aforementioned embodiments. Then, the conversion circuit 2201 having the semiconductor device is provided as a component of the power conversion device. The conversion circuit 2201 is a circuit for converting power inputted thereto to output the converted power.

Then, the driving circuit 2202 is provided as a component of the power conversion device. The driving circuit 2202 is a circuit for outputting a driving signal for driving the semiconductor device to the semiconductor device. Then, the control circuit 2203 is provided as a component of the power conversion device. The control circuit 2203 is a circuit for outputting a control signal for controlling the driving circuit 2202 to the driving circuit 2202.

The semiconductor switching elements used in the aforementioned embodiments are not limited to switching elements made of silicon (Si) semiconductors. For example, the semiconductor switching elements may be made of non-Si semiconductor materials that have a wider bandgap than Si semiconductors.

Examples of wide bandgap semiconductors that are non-Si semiconductor materials include silicon carbide, gallium nitride materials, and diamond.

The switching elements made of wide bandgap semiconductors are usable in a high-voltage region in which unipolar operation is difficult for Si semiconductors, and are capable of significantly reducing switching losses generated during switching operations. This allows a significant reduction in power losses.

In addition, the switching elements made of wide bandgap semiconductors are low in power losses and high in heat resistance. Thus, when forming a power module including a cooling section, the switching elements made of wide bandgap semiconductors reduce the size of heat dissipation fins of a heat sink to allow a further reduction in size of a semiconductor module.

The switching elements made of wide bandgap semiconductors are also suitable for high-frequency switching operations. Thus, when applied to a converter circuit strongly required for higher frequencies, the switching elements made of wide bandgap semiconductors allow a reduction in size of a reactor or a capacitor connected to the converter circuit because of the higher switching frequencies.

Therefore, the semiconductor switching elements in the aforementioned embodiments produce similar effects when the switching elements are made of wide bandgap semiconductors such as silicon carbide.

<Effects Produced by Aforementioned Embodiments>

The following are examples of the effects produced by the aforementioned embodiments. In the following description, the effects will be described based on the specific configurations exemplified in the aforementioned embodiments, but may be replaced with other specific configurations exemplified in the present description to the extent that similar effects are produced.

Such replacement may be made across multiple embodiments. That is, the configurations exemplified in different embodiments may be combined to produce similar effects.

According to the aforementioned embodiments, the semiconductor device includes: the drift layer 1 of the first conductivity type (n type); a first well region of the second conductivity type (p type); the n type source region 11; a gate electrode; an interlayer insulation film; the source electrode 51; the back surface electrode 8; a p type second well region; the field insulation film 4; and a gate portion. The first well region corresponds to, for example, the device well region 9 and the like. The gate electrode corresponds to, for example, any one of the gate electrode 13, the gate electrode 113, the gate electrode 313, the gate electrode 413, and the like (for convenience, any one of these will be described in corresponding relation in some cases). The interlayer insulation film corresponds to, for example, any one of the interlayer insulation film 14, the interlayer insulation film 114, the interlayer insulation film 214, the interlayer insulation film 414, and the like (for convenience, any one of these will be described in corresponding relation in some cases). The second well region corresponds to, for example, the termination well region 2 and the like. The gate portion corresponds to, for example, any one of the gate portion 52, the gate portion 252, the gate portion 352, the gate portion 452, and the like (for convenience, any one of these will be described in corresponding relation in some cases). The device well region 9 is formed in the surface layer of the upper surface of the drift layer 1. The source region 11 is formed in the surface layer of the device well region 9. The gate insulation film 12 is formed in contact with the device well region 9 sandwiched between the source region 11 and the drift layer 1. The gate electrode 13 is formed in contact with the gate insulation film 12. The interlayer insulation film 14 covers the gate electrode 13. The source electrode 51 covers the source region 11 exposed at the upper surface of the drift layer 1, and the interlayer insulation film 14. The back surface electrode 8 is formed on the lower surface side of the drift layer 1. The termination well region 2 is formed in the surface layer of the upper surface of the drift layer 1, and surrounds the device well region 9 as seen in plan view. The field insulation film 4 partially covers the termination well region 2. The gate electrode 13 is formed so as to extend to the upper surface of the field insulation film 4. The interlayer insulation film 14 partially covers the gate electrode 13 on the upper surface of the field insulation film 4. The semiconductor device includes the gate portion 52. The gate portion 52 overlaps the field insulation film 4 as seen in plan view, and is spaced from the source electrode 51. The gate portion 52 covers the interlayer insulation film 14 and the gate electrode 13 exposed from the interlayer insulation film 14. If an edge portion in a direction away from the device well region 9 as seen in plan view is defined as an outside edge portion, the outside edge portion of the gate electrode 13 is farther from the device well region 9 than the outside edge portion of the gate portion 52 and closer to the device well region 9 than the outside edge portion of the termination well region 2.

Such a configuration allows the mitigation of the electric field concentration in the outer peripheral edge portion of the gate portion 52 to suppress the generation of precipitates in the edge portion of the gate portion 52 in the termination region. Thus, cracking or separation of the gate portion 52 is suppressed. This suppresses a leakage current increase and a gaseous discharge which result from the cracking or separation of the gate portion 52 to thereby improve the insulation reliability of the MOSFET 100.

Similar effects are produced even when other configurations exemplified in the present description are added to the aforementioned configuration as appropriate, i.e. even when other configurations in the present description which are not mentioned as the aforementioned configuration are added as appropriate.

According to the aforementioned embodiments, the outside edge portion of the gate electrode 13 formed so as to extend to the upper surface of the field insulation film 4 is farther from the device well region 9 than the outside edge portion of the gate portion 52 and closer to the device well region 9 than the outside edge portion of the termination well region 2 around the entire perimeter surrounding the device well region 9. Such a configuration allows the mitigation of the electric field concentration in all regions of the outer peripheral edge portion under the gate portion 52 to suppress the generation of precipitates such as aluminum hydroxide.

According to the aforementioned embodiments, the gate electrode 113 formed so as to extend to the upper surface of the field insulation film 4 has an opening formed therein. In such a configuration, the presence of the gate electrode 113 under the outer peripheral edge portion of the gate pad 52p where the electric field concentration is especially prone to occur mitigates the electric field concentration in the outer peripheral edge portion under the gate pad 52p to suppress the production of aluminum hydroxide. On the other hand, the gate electrode 13 is not provided between the gate pad 52p and the termination well region 2, whereby the potential difference between the gate pad 52p and the termination well region 2 is shared by the field insulation film 4 and the interlayer insulation film 14. This mitigates the electric field concentration inside the field insulation film 4 to suppress the reduction in yield due to intruding dust or the like during the manufacture of the MOSFET 100.

According to the aforementioned embodiments, the interlayer insulation film 114 partially covers the gate electrode 13 while exposing at least part of the outside edge portion of the gate electrode 13 on the upper surface of the field insulation film 4. The gate portion covers at least part of the outside edge portion of the gate electrode 13 exposed from the interlayer insulation film 114. In such a configuration, the contact hole is formed in the interlayer insulation film 114 in the position of the outermost periphery of the gate pad 152p, so that the gate pad 152p and the gate electrode 13 are connected to each other through the contact hole on the outermost periphery of the gate pad 152p. This sufficiently suppresses the electric field concentration in the outer peripheral edge portion under the gate pad 152p to suppress the production of aluminum hydroxide.

According to the aforementioned embodiments, the drift layer 1 contains silicon carbide. Such a configuration suppresses a leakage current increase and a gaseous discharge which result from the cracking or separation of the gate portion 52 even in the silicon carbide semiconductor device in which the use of silicon carbide is prone to apply high electric field strength to the termination region, to thereby improve the insulation reliability of the MOSFET 100. This eliminates the need for measures such as increasing the width of the termination region or increasing the thickness of the insulation film around the surface electrode for the purpose of mitigating the electric field strength. As a result, an increase in manufacturing costs of semiconductor chips is suppressed.

According to the aforementioned embodiments, the thickness of the field insulation film 4 is greater than that of the gate insulation film 12. Such a configuration allows the mitigation of the electric field concentration in the outer peripheral edge portion of the gate portion 52 to suppress the generation of precipitates in the edge portion of the gate portion 52 in the termination region. Thus, the cracking or separation of the gate portion 52 is suppressed.

According to the aforementioned embodiments, the source electrode 51 and the gate portion 52 are made of metal containing at least one selected from the group consisting of Al, Cu, Mo, Ni, and Ti, or an Al alloy. Such a configuration allows the mitigation of the electric field concentration in the outer peripheral edge portion of the gate portion 52 to suppress the generation of precipitates in the edge portion of the gate portion 52 in the termination region. Thus, the cracking or separation of the gate portion 52 is suppressed.

According to the aforementioned embodiments, the interlayer insulation film 14 has an elemental composition of boron or phosphorus. Even when the interlayer insulation film 14 has a smoothly stepped shape, such a configuration improves the insulation reliability of the semiconductor device while suppressing the generation of precipitates.

According to the aforementioned embodiments, the impurity concentration per unit area of the termination well region 2 is not less than $2 \times 10^{13}$ cm$^{-2}$. Such a configuration makes it difficult for the depletion layer to extend into the termination well region 2 in the OFF state.

According to the aforementioned embodiments, the semiconductor device includes a third well region of the second conductivity type (p type). The third well region corresponds to, for example, the low-concentration well region 3 and the like. The low-concentration well region 3 is formed in the surface layer of the upper surface of the drift layer 1, and surrounds the termination well region 2 as seen in plan view. The impurity concentration of the low-concentration well region 3 is not greater than that of the termination well region 2. Such a configuration allows the mitigation of the electric field concentration in the outer peripheral edge portion of the gate portion 52 to suppress the generation of precipitates in the edge portion of the gate portion 52 in the termination region. Thus, the cracking or separation of the gate portion 52 is suppressed.

According to the aforementioned embodiments, the gate portion 52 (or the gate portion 252) includes the gate pad 52*p* (or the gate pad 152*p*) and the gate interconnect line 52*w* (or the gate interconnect line 252*w*) connected to the gate pad 52*p* (or the gate pad 152*p*). Such a configuration allows the mitigation of the electric field concentration in the outer peripheral edge portion of the gate portion 52 to suppress the generation of precipitates in the edge portion of the gate portion 52 in the termination region. Thus, the cracking or separation of the gate portion 52 is suppressed.

According to the aforementioned embodiments, the gate interconnect line 252*w* is provided so as to surround the source electrode 51 as seen in plan view. Such a configuration allows the mitigation of the electric field concentration in the outer peripheral edge portion of the gate interconnect line 252*w* surrounding the source electrode 51 to suppress the generation of precipitates in the edge portion of the gate interconnect line 252*w* in the termination region. Thus, the cracking or separation of the gate interconnect line 252*w* is suppressed.

According to the aforementioned embodiments, the gate portion 352 (or the gate portion 452) includes the gate pad 52*p* (or the gate pad 152*p*) and the gate interconnect line 352*w* (or the gate interconnect line 452*w*) in spaced apart relation to the gate pad 52*p* (or the gate pad 152*p*). Such a configuration allows the mitigation of the electric field concentration in the outer peripheral edge portion of the gate portion 352 to suppress the generation of precipitates in the edge portion of the gate portion 352 in the termination region. Thus, the cracking or separation of the gate portion 352 is suppressed.

According to the aforementioned embodiments, the gate interconnect line 352*w* (or the gate interconnect line 452*w*) is provided so as to surround the source electrode 51 as seen in plan view. Such a configuration allows the mitigation of the electric field concentration in the outer peripheral edge portion of the gate interconnect line 352*w* surrounding the source electrode 51 to suppress the generation of precipitates in the edge portion of the gate interconnect line 352*w* in the termination region. Thus, the cracking or separation of the gate interconnect line 352*w* is suppressed.

According to the aforementioned embodiments, the gate electrode 313 (or the gate electrode 413) formed so as to extend to the upper surface of the field insulation film 4 has an opening formed therein in part of a region that does not overlap the gate pad 52*p* (or the gate pad 152*p*) and the gate interconnect line 352*w* (or the gate interconnect line 452*w*). Even if having a parasitic gate resistor, such a configuration allows the mitigation of the electric field concentration in the outer peripheral edge portion of the gate interconnect line 452*w* surrounding the source electrode 51 to suppress the generation of precipitates in the edge portion of the gate interconnect line 452*w* in the termination region. Thus, the cracking or separation of the gate interconnect line 452*w* is suppressed.

According to the aforementioned embodiments, the power conversion device includes: the conversion circuit 2201 having the aforementioned semiconductor device and for converting inputted power to output the converted power; the driving circuit 2202 for outputting a driving signal for driving the semiconductor device to the semiconductor device; and the control circuit 2203 for outputting a control signal for controlling the driving circuit 2202 to the driving circuit 2202. Such a configuration allows the mitigation of the electric field concentration in the outer peripheral edge portion of the gate portion 52 to suppress a leakage current increase and a gaseous discharge which result from the cracking or separation of the gate portion 52, thereby improving the insulation reliability of the power conversion device.

<Modifications of Aforementioned Embodiments>

The material properties, materials, dimensions, shapes, and relative positional relationship of the components or conditions for implementation are described in some cases in the aforementioned embodiments. These are, however, merely examples in all aspects and shall not be restrictive.

Thus, numerous unillustrative modifications and equivalents can be assumed within the technical scope disclosed in the present description. Examples of these shall include an instance where at least one component is modified, added or dispensed with and an instance where at least one component in at least one embodiment is extracted and combined with a component in another embodiment.

When referred to without being particularly specified in the aforementioned embodiments, a material shall contain another additive, e.g. an alloy, so long as no inconsistencies arise.

So long as no inconsistencies arise, "one" component described in the aforementioned embodiments may include "not less than one" component.

Further, each of the components in the aforementioned embodiments is a conceptual unit. An instance where a component includes a plurality of structures, an instance where a component corresponds to part of a structure, and an instance where components are provided in one structure shall be included in the technical scope disclosed in the present description.

Also, each of the components in the aforementioned embodiments shall include structures having other configurations or shapes, so long as the same function is performed.

The description given in the present description is referred to for all purposes associated with the present technique and is not recognized as background art.

EXPLANATION OF REFERENCE SIGNS

1 Drift layer; 2 Termination well region; 3 Low-concentration well region; 4 Field insulation film; 6 Front surface protective film; 8 Back surface electrode; 9 Device well region; 11 Source region; 12 Gate insulation film; 13, 113, 313, 413 Gate electrodes; 14, 114, 214, 314, 414 Interlayer insulation films; 19 Contact region; 20 High-concentration portion; 30 Epitaxial substrate; 31 Monocrystalline substrate; 32 Epitaxial layer; 50 Front surface electrode; 51 Source electrode; 52, 252, 352, 452 Gate portions; 52p, 152p Gate pads; 52w, 252w, 352w, 452w Gate interconnect lines; 100, 200, 300, 400 MOSFETs; 2100 Power supply; 2200 Power conversion device; 2201 Conversion circuit; 2202 Driving circuit; 2203 Control circuit; and 2300 Load.

The invention claimed is:

1. A semiconductor device comprising:
a drift layer of a first conductivity type;
a first well region of a second conductivity type formed in a surface layer of an upper surface of the drift layer;
a source region of the first conductivity type formed in a surface layer of the first well region;
a gate insulation film formed in contact with the first well region sandwiched between the source region and the drift layer;
a gate electrode formed in contact with the gate insulation film;
an interlayer insulation film covering the gate electrode;
a source electrode covering the source region exposed at the upper surface of the drift layer, and the interlayer insulation film;
a back surface electrode formed on a lower surface side of the drift layer;
a second well region of the second conductivity type formed in the surface layer of the upper surface of the drift layer and surrounding the first well region as seen in plan view; and
a field insulation film partially covering the second well region,
the gate electrode being formed so as to extend to an upper surface of the field insulation film,
the interlayer insulation film partially covering the gate electrode on the upper surface of the field insulation film,
the semiconductor device further comprising
a gate portion overlapping the field insulation film as seen in plan view and spaced from the source electrode, the gate portion covering the interlayer insulation film and the gate electrode exposed from the interlayer insulation film,
wherein an edge portion in a direction away from the first well region as seen in plan view is defined as an outside edge portion,
wherein the outside edge portion of the gate electrode is farther from the first well region than the outside edge portion of the gate portion and closer to the first well region than the outside edge portion of the second well region, and
wherein the gate electrode formed so as to extend to the upper surface of the field insulation film has an opening formed under the gate portion.

2. The semiconductor device according to claim 1, wherein the gate portion includes
a gate pad, and
a gate interconnect line connected to the gate pad.

3. The semiconductor device according to claim 2, wherein the gate interconnect line is provided so as to surround the source electrode as seen in plan view.

4. The semiconductor device according to claim 1, wherein the outside edge portion of the gate electrode formed so as to extend to the upper surface of the field insulation film is farther from the first well region than the outside edge portion of the gate portion and closer to the first well region than the outside edge portion of the second well region around the entire perimeter surrounding the first well region.

5. The semiconductor device according to claim 1, wherein the drift layer contains silicon carbide.

6. The semiconductor device according to claim 1, wherein the field insulation film has a thickness greater than that of the gate insulation film.

7. The semiconductor device according to claim 1, wherein the source electrode and the gate portion are made of metal containing at least one selected from the group consisting of Al, Cu, Mo, Ni, and Ti, or an Al alloy.

8. The semiconductor device according to claim 1, wherein the interlayer insulation film has an elemental composition of boron or phosphorus.

9. The semiconductor device according to claim 1, wherein the second well region has an impurity concentration per unit area of not less than $2\times10^{13}$ cm$^{-2}$.

10. The semiconductor device according to claim 1, further comprising
a third well region of the second conductivity type formed in the surface layer of the upper surface of the drift layer and surrounding the second well region as seen in plan view,
the third well region having an impurity concentration not greater than that of the second well region.

11. A power conversion device comprising:
a conversion circuit having a semiconductor device as recited in claim 1 and for converting inputted power to output the converted power;
a driving circuit for outputting a driving signal for driving the semiconductor device to the semiconductor device; and a control circuit for outputting a control signal for controlling the driving circuit to the driving circuit.

12. A semiconductor device comprising:
a drift layer of a first conductivity type;
a first well region of a second conductivity type formed in a surface layer of an upper surface of the drift layer;
a source region of the first conductivity type formed in a surface layer of the first well region;
a gate insulation film formed in contact with the first well region sandwiched between the source region and the drift layer;
a gate electrode formed in contact with the gate insulation film;
an interlayer insulation film covering the gate electrode;
a source electrode covering the source region exposed at the upper surface of the drift layer, and the interlayer insulation film;
a back surface electrode formed on a lower surface side of the drift layer;
a second well region of the second conductivity type formed in the surface layer of the upper surface of the drift layer and surrounding the first well region as seen in plan view; and
a field insulation film partially covering the second well region,
the gate electrode being formed so as to extend to an upper surface of the field insulation film,
the interlayer insulation film partially covering the gate electrode on the upper surface of the field insulation film,
the semiconductor device further comprising
a gate portion overlapping the field insulation film as seen in plan view and spaced from the source electrode, the gate portion covering the interlayer insulation film and the gate electrode exposed from the interlayer insulation film,
wherein an edge portion in a direction away from the first well region as seen in plan view is defined as an outside edge portion,
wherein the outside edge portion of the gate electrode is farther from the first well region than the outside edge portion of the gate portion and closer to the first well region than the outside edge portion of the second well region,
wherein the interlayer insulation film partially covers the gate electrode while exposing the gate electrode in the position of the outermost periphery of the gate portion, and
wherein the gate portion is connected to at least part of the gate electrode exposed from the interlayer insulation film in the position of the outermost periphery of the gate portion.

13. A semiconductor device comprising:
a drift layer of a first conductivity type;
a first well region of a second conductivity type formed in a surface layer of an upper surface of the drift layer;
a source region of the first conductivity type formed in a surface layer of the first well region;
a gate insulation film formed in contact with the first well region sandwiched between the source region and the drift layer;
a gate electrode formed in contact with the gate insulation film;
an interlayer insulation film covering the gate electrode;
a source electrode covering the source region exposed at the upper surface of the drift layer, and the interlayer insulation film;
a back surface electrode formed on a lower surface side of the drift layer;
a second well region of the second conductivity type formed in the surface layer of the upper surface of the drift layer and surrounding the first well region as seen in plan view; and
a field insulation film partially covering the second well region,
the gate electrode being formed so as to extend to an upper surface of the field insulation film,
the interlayer insulation film partially covering the gate electrode on the upper surface of the field insulation film,
the semiconductor device further comprising
a gate portion overlapping the field insulation film as seen in plan view and spaced from the source electrode, the gate portion covering the interlayer insulation film and the gate electrode exposed from the interlayer insulation film,
wherein an edge portion in a direction away from the first well region as seen in plan view is defined as an outside edge portion,
wherein the outside edge portion of the gate electrode is farther from the first well region than the outside edge portion of the gate portion and closer to the first well region than the outside edge portion of the second well region, and
wherein the gate portion includes
a gate pad, and
a gate interconnect line in spaced apart relation to the gate pad.

14. The semiconductor device according to claim 13,
wherein the gate interconnect line is provided so as to surround the source electrode as seen in plan view.

15. The semiconductor device according to claim 13,
wherein the gate electrode formed so as to extend to the upper surface of the field insulation film has an opening formed therein in part of a region that does not overlap the gate pad and the gate interconnect line as seen in plan view.

* * * * *